(12) United States Patent
Kawahito

(10) Patent No.: US 11,442,169 B2
(45) Date of Patent: Sep. 13, 2022

(54) DISTANCE-IMAGE-MEASURING APPARATUS AND DISTANCE-IMAGE-MEASURING METHOD

(71) Applicant: NATIONAL UNIVERSITY CORPORATION SHIZUOKA UNIVERSITY, Shizuoka (JP)

(72) Inventor: Shoji Kawahito, Hamamatsu (JP)

(73) Assignee: NATIONAL UNIVERSITY CORPORATION SHIZUOKA UNIVERSITY

( * ) Notice: Subject to any disclaimer, the term of this patent is extended or adjusted under 35 U.S.C. 154(b) by 401 days.

(21) Appl. No.: 16/637,028

(22) PCT Filed: Aug. 7, 2018

(86) PCT No.: PCT/JP2018/029624
§ 371 (c)(1),
(2) Date: Feb. 6, 2020

(87) PCT Pub. No.: WO2019/031510
PCT Pub. Date: Feb. 14, 2019

(65) Prior Publication Data
US 2020/0243585 A1 Jul. 30, 2020

(30) Foreign Application Priority Data
Aug. 8, 2017 (JP) ............................ JP2017-153455

(51) Int. Cl.
*G01S 17/894* (2020.01)
*G01S 7/48* (2006.01)
(Continued)

(52) U.S. Cl.
CPC .......... *G01S 17/894* (2020.01); *G01S 7/4865* (2013.01); *G01S 17/10* (2013.01); *H01L 27/14609* (2013.01)

(58) Field of Classification Search
CPC ...... G01S 17/894; G01S 7/4865; G01S 17/10; G01S 7/4863; H01L 27/14609; G01C 3/06
See application file for complete search history.

(56) References Cited

U.S. PATENT DOCUMENTS 9,621,833 B2 * 4/2017 Mabuchi ................ H04N 5/379
10,015,417 B2 * 7/2018 Mitsunaga ......... H04N 9/04555

FOREIGN PATENT DOCUMENTS

| JP | 2010-032425 A | 2/2010 |
| JP | 2011-022089 A | 2/2011 |
| WO | WO 2015/118884 A1 | 8/2015 |

OTHER PUBLICATIONS

International Preliminary Report on Patentability dated Feb. 13, 2020 in corresponding International Application No. PCT/JP2018/029624.
(Continued)

*Primary Examiner* — Seung C Sohn
(74) *Attorney, Agent, or Firm* — Ostrolenk Faber LLP

(57) ABSTRACT

A distance image sensor includes a light source, a light source control means for controlling the light source, a pixel circuit including a photoelectric conversion region, charge readout regions, and control electrodes, a charge transfer control means for sequentially applying a control pulse to the control electrodes, and a distance calculation means for reading voltages of the charge readout regions as detection signals and repeatedly calculating a distance on the basis of the detection signals, and the distance calculation means calculates a sum value of signal components of charge generated from the pulsed light other than background light among the detection signals, calculates a distance from the detection signals using a predetermined equation when the sum value exceeds a first threshold value, and invalidates the
(Continued)

calculation of the distance when the sum value does not exceed the first threshold value.

12 Claims, 26 Drawing Sheets

(51) Int. Cl.
    *G01S 17/10*     (2020.01)
    *H01L 27/146*     (2006.01)
    *G01S 7/4865*     (2020.01)

(56) References Cited

OTHER PUBLICATIONS

International Search Report dated Nov. 6, 2018 in corresponding International Application No. PCT/JP2018/029624.

* cited by examiner

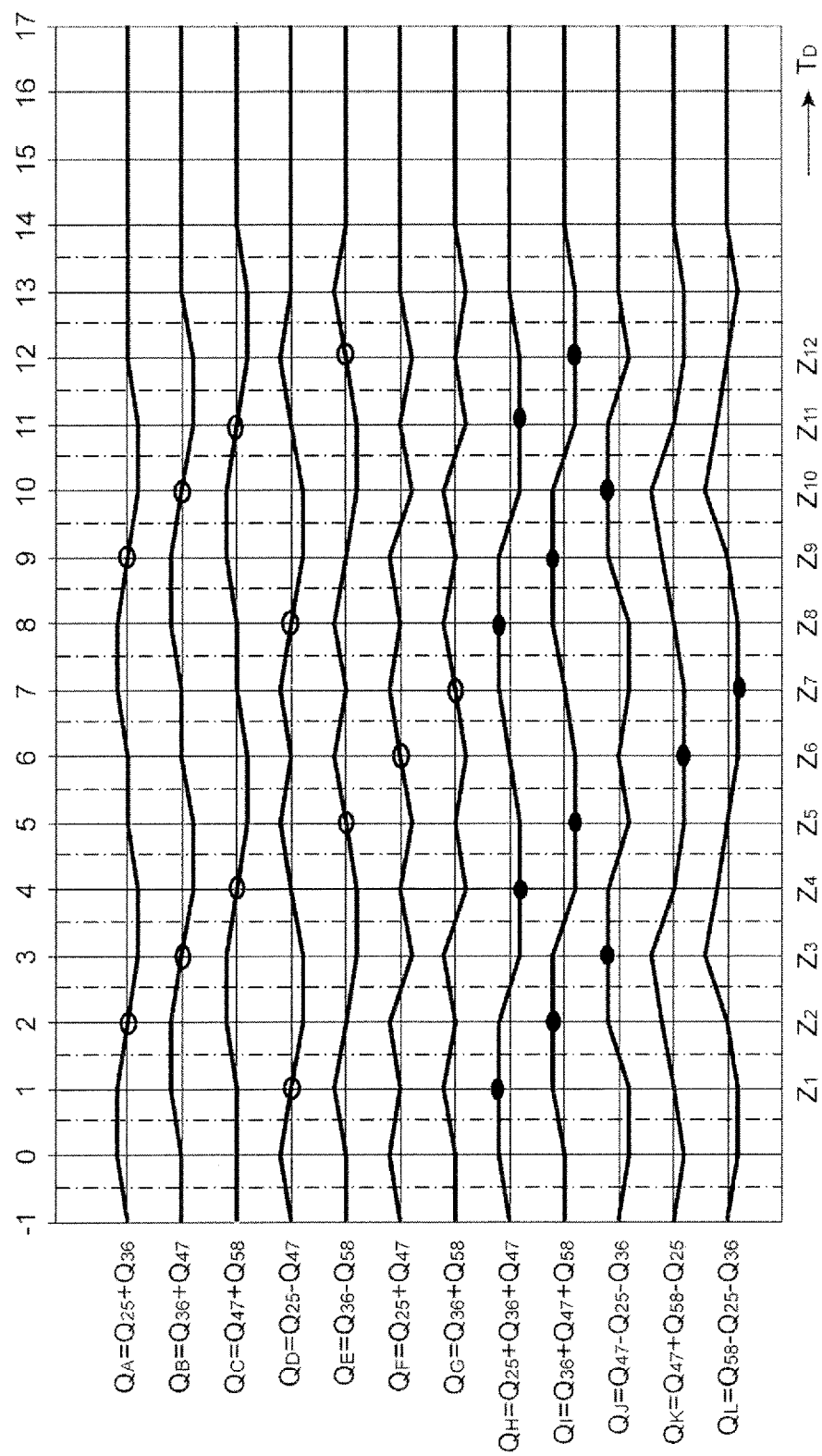

US 11,442,169 B2

DISTANCE-IMAGE-MEASURING APPARATUS AND DISTANCE-IMAGE-MEASURING METHOD

CROSS-REFERENCE TO RELATED APPLICATIONS

The present application is a 35 U.S.C. §§ 371 national phase conversion of PCT/JP2018/029624, filed Aug. 7, 2018, which claims priority to Japanese Patent Application No. 2017-153455, filed Aug. 8, 2017, the contents of both of which are incorporated herein by reference. The PCT International Application was published in the Japanese language.

TECHNICAL FIELD

An aspect of the present invention relates to a distance image measuring apparatus and a distance image measuring method for generating a distance image including distance information for each pixel.

BACKGROUND ART

In the related art, a sensor device that generates an image signal including distance information using a time of flight of light has been used (see, for example, Patent Literature 1 below). This sensor irradiates a target with a sequence of first to fifth pulses as irradiation pulses in first to fifth frames arranged on a time axis, and generates an image signal including distance information of the target in a pixel array. With such a configuration, it is possible to expand a distance measurement range without degradation of a distance resolution.

CITATION LIST

Patent Literature

[Patent Literature 1] Japanese Unexamined Patent Publication No. 2010-32425

SUMMARY OF INVENTION

Technical Problem

However, in the sensor device of the related art described above, when the target is located outside a measurement possibility range, an image signal including false distance information may be generated. That is, it is difficult to determine which of pieces of distance information obtained through a plurality of calculations for the same target is true information, and, as a result, accuracy of the distance information included in the image signal may be degraded.

An aspect of the present invention has been made in view of the above problem, and an object of the present invention is to provide a distance image measuring apparatus and a distance image measuring method capable of generating a highly accurate image signal regardless of a position of a target.

Solution to Problem

In order to solve the above problem, a distance image measuring apparatus according to an embodiment of the present invention includes a light source configured to generate pulsed light; a light source control means configured to control the light source so that the light source repeatedly generates the pulsed light with a first duration within a period of one frame; a pixel circuit part including a photoelectric conversion region configured to convert light into charge, first to M-th (M is an integer equal to or greater than 3) charge readout regions provided in proximity to the photoelectric conversion region and apart from each other, and first to M-th control electrodes provided in correspondence to the photoelectric conversion region and the first to M-th charge readout regions, for applying first to M-th control pulses for charge transfer between the photoelectric conversion region and the first to M-th charge readout regions; a charge transfer control means configured to apply the first control pulse to the first control electrode during a second duration, the second duration being equal to or longer than the first duration in correspondence to the generation of the pulsed light by the light source control means, and then, sequentially apply the second to M-th control pulses to the second to M-th control electrodes during the second duration; a voltage detection means configured to read out voltages of the first to M-th charge readout regions of the pixel circuit part as first to M-th detection signals after the application of the first to M-th control pulses by the charge transfer control means; and a distance calculation means configured to repeatedly calculate a distance on the basis of the first to M-th detection signals, wherein the distance calculation means calculates a sum value of signal components of charge generated from the pulsed light other than background light in the first to M-th detection signals on the basis of the first to M-th detection signals, calculates the distance from the first to M-th detection signals using a predetermined calculation equation when the sum value of the signal components exceeds a first predetermined threshold value, and invalidates the calculation of the distance when the sum value of the signal components does not exceed the first threshold value.

Alternatively, a distance image measuring method according to another aspect of the present invention includes a light source control step of controlling, by a light source control means, a light source so that the light source repeatedly generates pulsed light with a first duration within a period of one frame; a charge transfer control step of applying, by a charge transfer control means, a first control pulse for controlling transfer of charge to a first control electrode during a second duration, the second duration being equal to or longer than the first duration in correspondence to the generation of the pulsed light by the light source control means, and then, sequentially applying second to M-th control pulses for controlling transfer of charge to second to M-th control electrodes during the second duration, by using a pixel circuit part including a photoelectric conversion region configured to convert light into charge, first to M-th (M is an integer equal to or greater than 3) charge readout regions provided in proximity to the photoelectric conversion region and apart from each other, and the first to M-th control electrodes provided in correspondence to the photoelectric conversion region and the first to M-th charge readout regions; a voltage detection step of reading out, by a voltage detection means, voltages of the first to M-th charge readout regions of the pixel circuit part as first to M-th detection signals after the application of the first to M-th control pulses by the charge transfer control means; and a distance calculation step of repeatedly calculating, by a distance calculation means, a distance on the basis of the first to M-th detection signals, wherein the distance calculation step includes calculating a sum value of signal components of charge generated from the pulsed light other than background light in the first to M-th detection signals on the basis of the first to M-th detection signals, calculating the distance from the first to M-th detection signals using a predetermined calculation equation when the sum value of the signal components exceeds a first predetermined threshold value, and invalidating the calculation of the distance when the sum value of the signal components does not exceed the first threshold value.

According to the distance image measuring apparatus or the distance image measuring method of the above aspect, the pulsed light is repeatedly generated from the light source within the period of one frame, the time window with the second duration equal to or longer than the duration of the pulsed light is sequentially set in correspondence to the generation of the pulsed light, and the charge is sequentially transferred from the photoelectric conversion region of the pixel circuit part to the first to M-th charge readout regions in the time window. Further, the first to M-th detection signals are read out from the first to M-th charge readout regions of the pixel circuit part, a sum value of the signal components of the charge generated from the pulsed light other than background light in the first to M-th detection signals is calculated on the basis of the first to M-th detection signals, and a determination is made as to whether the distance calculation using the first to M-th detection signals is valid on the basis of a result of comparison between the sum value of the signal components and the first threshold value. As a result, it is possible to generate a distance image in which a result of the valid distance calculation has been reflected by using a result of the determination, and to generate a highly accurate image signal regardless of the position of the target.

Advantageous Effects of Invention

According to an aspect of the present invention, it is possible to generate a highly accurate image signal regardless of a position of a target.

BRIEF DESCRIPTION OF DRAWINGS

FIG. 26 is a graph showing changes in various values calculated in a distance calculation procedure according to the modification example of the present invention with respect to a delay time $T_D$.

DESCRIPTION OF EMBODIMENTS

Hereinafter, preferred embodiments of a distance image measuring apparatus according to the present invention will be described in detail with reference to the drawings. In a description of the drawings, the same or corresponding parts will be denoted by the same reference signs, and a redundant description will be omitted.

First Embodiment

Figure 1:
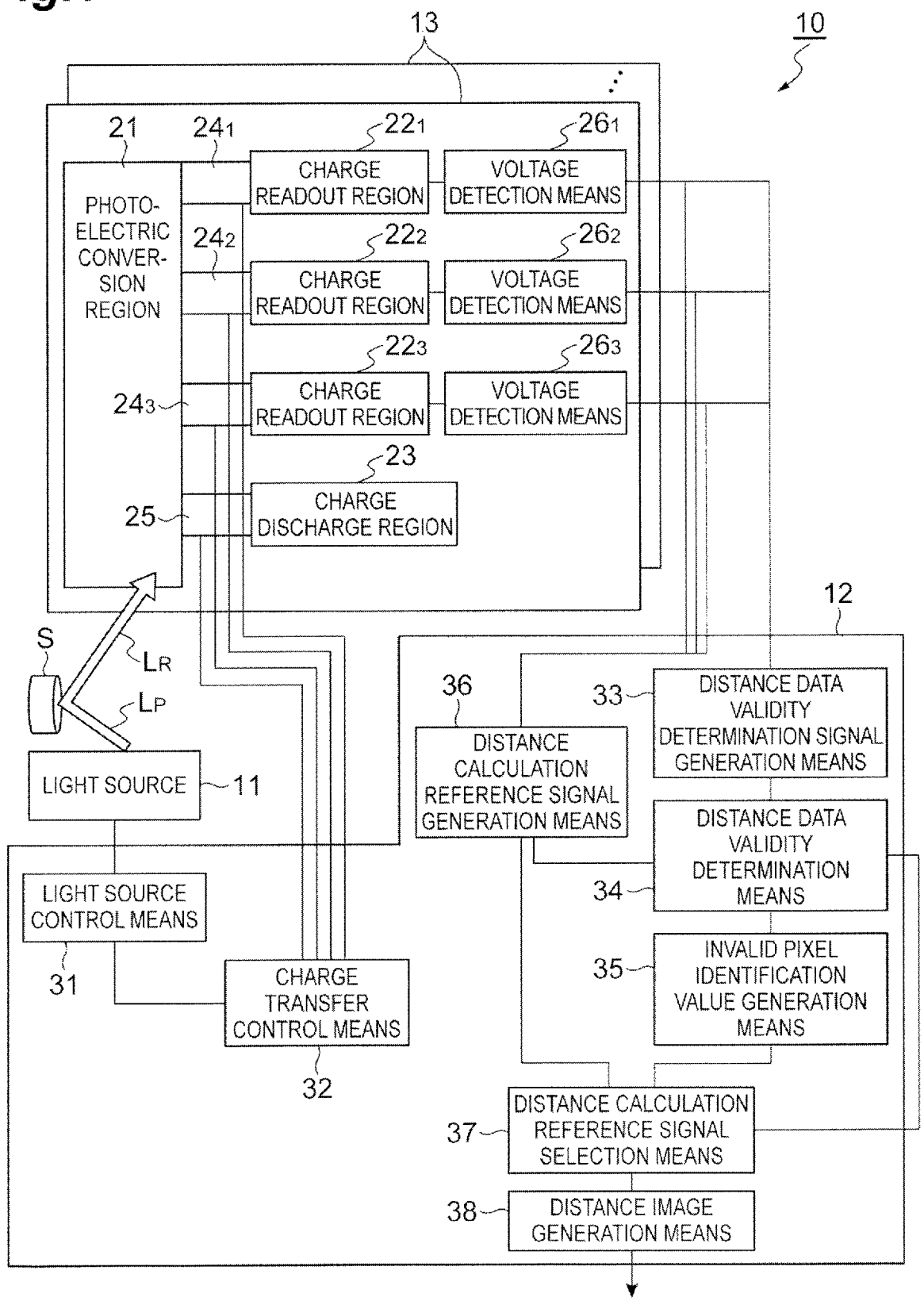
FIG. 1 is a block diagram illustrating a schematic configuration of a distance image sensor 10 according to a first embodiment of the present invention.

First, a function and configuration of a distance image sensor 10 according to a first embodiment of the distance image measuring apparatus of the present invention will be described with reference to FIG. 1. The distance image sensor 10 illustrated in FIG. 1 is a device that generates a distance image including distance information for each pixel using a time-of-flight method, and includes a light source 11, a computing circuit 12, and a plurality of pixel circuits (pixel circuit parts) 13. The light source 11 is a device that generates pulsed light $L_P$ with which a target S is irradiated, in order to perform distance measurement using a time-of-flight (TOF) scheme. The light source 11 includes, for example, a semiconductor light emitting element such as a light emitting diode or a laser diode, and a driving circuit that drives the semiconductor light emitting element. As the light source 11, an element that generates light in a wavelength region such as a near infrared region and a visible region can be used. Further, the distance image sensor 10 includes a plurality of pixel circuits 13. The plurality of pixel circuits 13 are arranged in a two-dimensional array in directions in two dimensions (for example, a column direction and a row direction) to constitute an image sensor, and photoelectrically converts incident pulsed light $L_R$ generated due to reflection of the pulsed light $L_P$ at the target S to generate a detection signal. In addition, the distance image sensor 10 includes the computing circuit 12. The computing circuit 12 calculates distance information on the target S for each pixel using the detection signals generated by the plurality of pixel circuits 13, and generates and outputs a distance image including two-dimensional image information in which the distance information for each pixel is reflected. The computing circuit 12 may be configured of a dedicated integrated circuit such as a one-chip microcomputer including a CPU, a RAM, a ROM, an input/output device, and the like or may be configured of a general-purpose computer such as a personal computer.

Hereinafter, configurations of the pixel circuit 13 and the computing circuit 12 will be described in detail.

First, the configuration of the pixel circuit 13 will be described. The pixel circuit 13 includes a photoelectric conversion region 21 configured of semiconductor elements and having a function of converting the incident pulsed light $L_R$ to charge, first to third charge readout regions $22_1$ to $22_3$ and a charge discharge region 23 provided in proximity to the photoelectric conversion region 21 and apart from each other, first to third control electrodes $24_1$ to $24_3$ and a control electrode 25 provided in correspondence to the first and third charge readout regions $22_1$ to $22_3$ and the charge discharge region 23, for applying a control pulse for charge transfer between the photoelectric conversion region 21 and the respective regions, and voltage detection means $26_1$ to $26_3$ for reading out detection signals from the first and third charge readout regions $22_1$ to $22_3$. The voltage detection means $26_1$ to $26_3$ are, for example, amplifiers including a source follower amplifier, and selectively detect and amplify voltages based on reference potentials of the respective charge readout regions $22_1$ to $22_3$ under the control of the computing circuit 12, and output the amplified voltages to the computing circuit 12 as first to third detection signals.

The pixel circuit 13 is formed on, for example, a p-type semiconductor substrate such as a silicon substrate. That is, the photoelectric conversion region 21 is provided in a central portion of a pixel formation area including an active region forming layer formed of a p-type semiconductor, an n-type surface buried region, a p-type pinning layer, and an insulating film, which are formed in this order on the p-type semiconductor substrate. The n-type charge readout regions $22_1$ to $22_3$ and the charge discharge region 23 having a higher impurity concentration than the active region forming layer are formed at positions spaced from each other to be close to the photoelectric conversion region 21, and control electrodes $24_1$ to $24_3$ and 25 are provided on respective charge transfer paths from the photoelectric conversion region 21 on the insulating film to the charge readout regions $22_1$ to $22_3$ and the charge discharge region 23. Here, the respective control electrodes $24_1$ to $24_3$ and 25 may be provided on the charge transfer path, or may be separately provided in a plurality of electrode portions to sandwich the charge transfer path from both sides.

In the pixel circuit 13 having the above configuration, control pulses having different phases are applied from the computing circuit 12 to be described below to the control electrodes $24_1$ to $24_3$ and 25. Thereby, depletion potentials of the surface buried region are sequentially changed, such that potential gradients allowing charge to be transferred to any of the charge transfer paths are sequentially formed, and majority carriers (charge) generated in the surface buried region of the photoelectric conversion region 21 are moved to any one of the charge readout regions $22_1$ to $22_3$ and the charge discharge region 23.

Next, a configuration of the computing circuit 12 will be described. The computing circuit 12 includes, as functional components, a light source control means 31, a charge transfer control means 32, a distance data validity determination signal generation means 33, a distance data validity determination means 34, an invalid pixel identification value generation means 35, a distance calculation reference signal generation means 36, a distance calculation reference signal selection means 37, and a distance image generation means 38. The distance data validity determination signal generation means 33, the distance data validity determination means 34, the invalid pixel identification value generation means 35, the distance calculation reference signal generation means 36, the distance calculation reference signal selection means 37, and the distance image generation means 38 constitute a distance calculation means of the embodiment.

The light source control means 31 of the computing circuit 12 controls a light emission timing of the pulsed light $L_P$ in the light source 11, an intensity of the pulsed light $L_P$, and a pulse width of the pulsed light $L_P$. Specifically, light source control means 31 performs control so that the pulsed light $L_P$ with the duration $T_0$ is repeatedly generated within a period of one frame, which is a preset distance calculation repetition period. The charge transfer control means 32 has a function of applying first to third control pulses $G_1$ to $G_3$ and a control pulse $G_D$ to the respective control electrodes $24_1$ to $24_3$ and 25. That is, the charge transfer control means 32 sequentially applies the first to third control pulses $G_1$ to $G_3$ to the control electrodes $24_1$ to $24_3$ only during the duration $T_1$ that is equal to or longer than the duration $T_0$ in correspondence to the respective generation timings of the pulsed light $L_P$ within a period of one frame. In the embodiment, the duration $T_1$ is set to be equal to the duration $T_0$. Further, the charge transfer control means 32 applies, to the control electrode 25, the control pulse $G_D$ for discharging the charge accumulated in the photoelectric conversion region 21 to the charge discharge region 23 before a series of application timings of the first to third control pulses $G_1$ to $G_3$.

A resolution of 15 cm of the distance calculation using a time of flight of the pulsed light $L_P$ corresponds to a time of flight of 1 ns, and a control means having a time accuracy of the order of ps is required as a guide in order to improve this resolution. Therefore, since the charge transfer control means 32 and the light source control means 31 need to be designed in consideration of, for example, a wiring capacitance integrated with the pixel circuit 13, it is preferable for the charge transfer control means 32 and the light source control means 31 to be foamed on a semiconductor layer integrated with the pixel circuit 13. "On a semiconductor layer integrated" also includes "on a different semiconductor layer" among a plurality of semiconductor layers stacked using a silicon on insulator (SOI) technology or a through-silicon via (TSV) technology. Specifically, the charge transfer control means 32, a circuit between the charge transfer control means 32 and the control electrodes $24_1$ to $24_3$ and 25, and a part of a circuit between the charge transfer control means 32 and the light source control means 31 may be formed on the same semiconductor as the pixel circuit 13 or on a semiconductor layer stacked together with the pixel circuit 13.

The distance calculation means of the computing circuit 12 repeatedly executes the calculation of the distance for each pixel circuit 13 in correspondence to the light emission timing of the pulsed light $L_P$, and repeatedly generates a distance image including the obtained distance information. The distance data validity determination signal generation means 33 constituting the distance calculation means generates, as the distance data validity determination signal $S_A$, a sum value of the signal components of the charge generated from the incident pulsed light $L_R$ other than signal components of background light in the first to third detection signals $S_1$ to $S_3$ output from the pixel circuit 13 in correspondence to the light emission timing of the pulsed light $L_P$ on the basis of the first to third detection signals $S_1$ to $S_3$. The distance data validity determination signal $S_A$ is a signal indicating whether or not the first to third detection signals $S_1$ to $S_3$ strongly reflect the incident pulsed light $L_R$, and is a signal for determining whether or not the calculation of the distance based on the first to third detection signals $S_1$ to $S_3$ is valid. The distance data validity determination means 34 determines whether the calculation of the distance based on the first to third detection signals $S_1$ to $S_3$ is valid on the basis of the distance data validity determination signal $S_A$. Specifically, the distance data validity determination means 34 compares the distance data validity determination signal $S_A$ with a predetermined threshold value (first threshold value) $Th_1$, determines that the distance calculation is valid when the distance data validity determination signal $S_A$ exceeds the threshold value $Th_1$, and determines that the distance calculation is invalid when the distance data validity determination signal $S_A$ is equal to or smaller than the threshold value $Th_1$. The invalid pixel identification value generation means 35 generates an identification value indicating whether or not the distance calculation is invalid for each pixel corresponding to the pixel circuit 13 on the basis of a determination result of the distance data validity determination means 34.

The distance calculation reference signal generation means 36 of the distance calculation means generates a distance calculation reference signal $X_R$ serving as a basis for calculation of the distance on the basis of the first to third detection signals $S_1$ to $S_3$ output from the pixel circuit 13 in correspondence to the light emission timing of the pulsed light $L_P$. Specifically, the distance calculation reference signal generation means 36 generates the distance calculation reference signal $X_R$ by calculating a ratio between the difference between the two detection signals $S_1$ and $S_3$ and the distance data validity determination signal $S_A$. The distance calculation reference signal selection means 37 determines whether or not the position of the target S is within a measurement possibility range on the basis of the distance calculation reference signal $X_R$, and outputs the distance calculation reference signal $X_R$ as a valid value to the distance image generation means 38 when the position of the target S is within the measurement possibility range. For example, the distance calculation reference signal selection means 37 compares the value of the distance calculation reference signal $X_R$ with a predetermined threshold value (a second threshold value) $Th_2$, and determines whether the distance calculation reference signal $X_R$ is valid or invalid according to a result of the comparison. When it is determined that the distance calculation is valid, the distance image generation means 38 calculates the distance information by referring to the distance calculation reference signal $X_R$ selected by the distance calculation reference signal selection means 37 for each pixel circuit 13. The distance image generation means 38 generates a distance image including the distance information corresponding to each pixel circuit 13 and outputs the generated distance image to an external device. Examples of the external device, which is an output destination, include output devices such as a display device and a communication interface device. In this case, the distance image generation means 38 can include an invalid value in the distance image for a pixel for which an identification value indicating that the distance information is invalid has been generated or a pixel for which the distance calculation reference signal $X_R$ has been determined to be outside the measurement possibility range.

Figure 2:
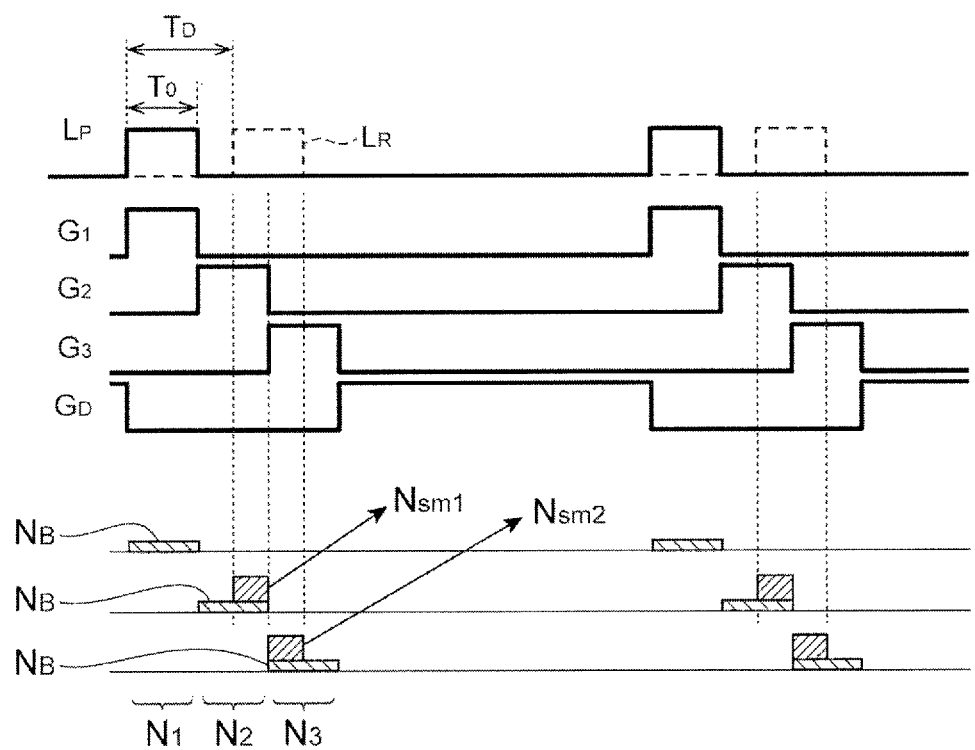
FIG. 2 is a timing chart for explaining a principle of distance calculation of the distance image sensor 10 in FIG. 1.

FIG. 2 is a timing chart for explaining a principle of distance calculation in the distance image sensor 10. In FIG. 2, timings of various signals that are controlled by the distance image sensor 10 and timings at which charge is accumulated in the respective regions of the pixel circuit 13 are illustrated, and the light emission timing of the pulsed light $L_P$, application timings of the first to third control pulses $G_1$ to $G_3$ and the control pulse $G_D$, and charge accumulation timings in the first to third charge readout regions $22_1$ to $22_3$ are illustrated in this order from the top. Thus, the first to third control pulses $G_1$ to $G_3$ are continuously applied with the duration $T_0$ not to overlap each other according to a light emission timing with the duration $T_0$ of the pulsed light $L_P$. Accordingly, the charge accumulated in the photoelectric conversion region 21 due to photoelectric conversion of the incident pulsed light $L_R$ is distributed to the two charge readout regions $22_2$ and $22_3$ at a ratio corresponding to the delay time $T_D$ of the incident pulsed light $L_R$ with respect to the pulsed light $L_P$. Here, by setting a relationship between the light emission timing with the duration $T_0$ of the pulsed light $L_P$ and the application timing of the first control pulse $G_1$, only a charge amount $N_B$ of charge caused by noise such as background light and a dark current is transferred to the charge readout region $22_1$ in a time window defined by the control pulse $G_1$. On the other hand, charge obtained by adding a charge amount $N_{sm1}$ distributed corresponding to the delay time $T_D$ to the charge amount $N_B$ is transferred to the charge readout region $22_2$ in a time window defined by the control pulse $G_2$. On the other hand, charge obtained by adding a charge amount $N_{sm2}$ distributed corresponding to the delay time $T_D$ to the charge amount $N_B$ is transferred to the charge readout region $22_3$ in a time window defined by the control pulse $G_3$. Using such a phenomenon, in the computing circuit 12 of the distance image sensor 10, it is possible to calculate the distance to the target S corresponding to the delay time $T_D$ by calculating a ratio between the charge amount $N_{sm1}$ excluding the charge amount $N_B$ and the charge amount $N_{sm2}$ excluding the charge amount $N_B$ according to the respective light emission timings of the pulsed light $L_P$.

Figure 3:
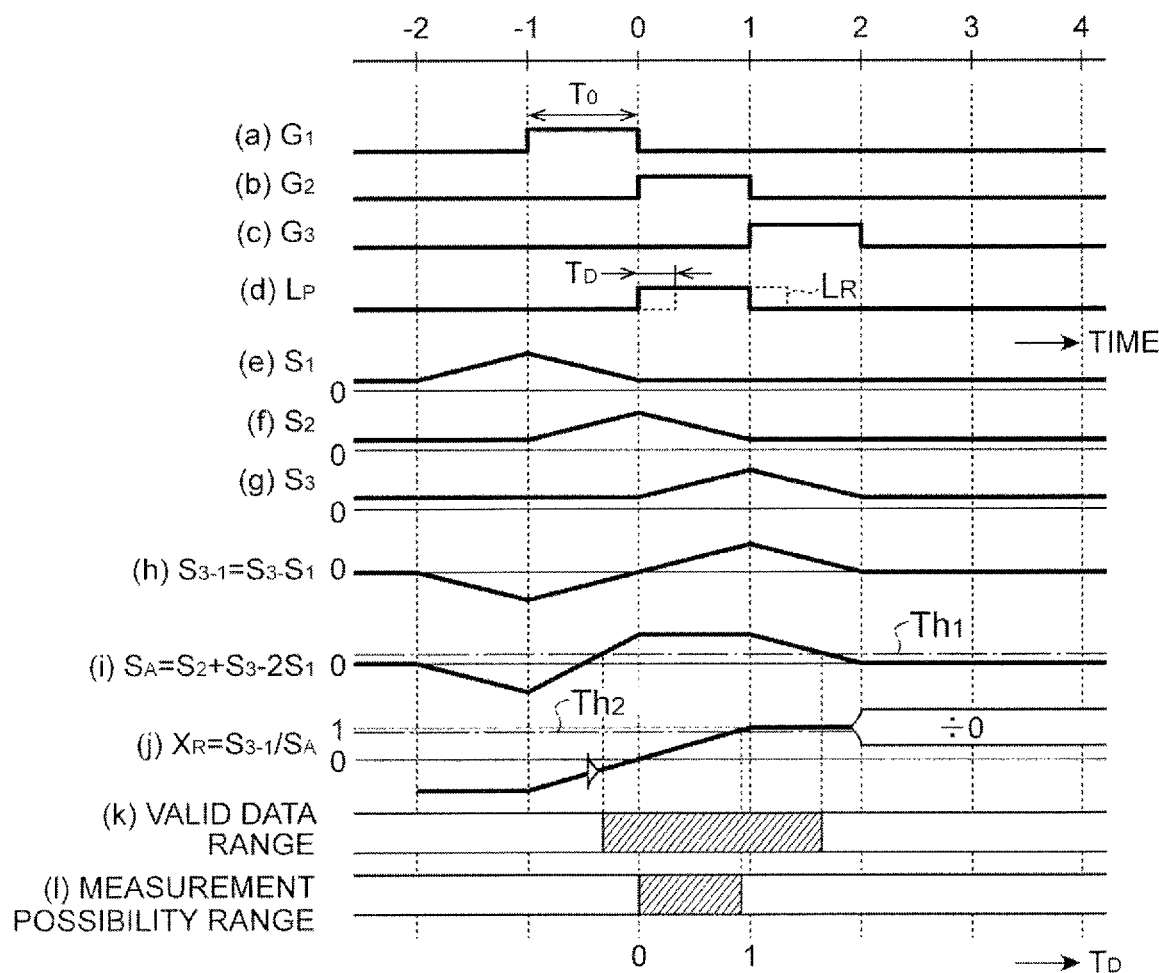
FIG. 3 is a timing chart of various signals that are handled by the distance image sensor 10 in FIG. 1 and a graph showing changes in various values calculated by the distance image sensor 10 with respect to a delay time $T_D$.

Next, details of a distance calculation procedure in the distance image sensor 10 will be described, and a distance image measuring method according to the embodiment (hereinafter also referred to as a "3-tap 1-zone scheme") will be described. FIG. 3 is a graph showing a timing chart of various signals that are handled by the distance image sensor 10 and changes in various calculated values with respect to a delay time $T_D$. In FIG. 3, timings of the control pulses $G_1$ to $G_3$ and the pulsed light $L_P$ are illustrated in parts (a) to (d), respectively. Values of the first to third detection signal $S_1$ to $S_3$, a value of the difference value $S_{1-3}$, the value of the distance data validity determination signal $S_A$, and the value of the distance calculation reference signal $X_R$ are illustrated in correspondence to the delay time $T_D$ in parts (e) to (j), respectively. The valid data range in the delay time $T_D$ is illustrated in a part (k). The measurement possibility range in the delay time $T_D$ is illustrated in a part (1). Here, the delay time $T_D$ is indicated by a value normalized by the duration $T_0$ of the pulsed light $L_P$.

First, when a distance image generation process is started by the distance image sensor 10, the light source control means 31 and the charge transfer control means 32 of the computing circuit 12 control timings of the control pulses $G_1$ to $G_3$ and the pulsed light $L_P$ within a period of one frame (a light source control step and a charge transfer control step). Specifically, the control pulses $G_1$ to $G_3$ are set at continuous timings so that the control pulses $G_1$ to $G_3$ do not overlap each other in the duration $T_1 = T_0$, and the timing of the pulsed light $L_P$ is set to substantially overlap the timing of the control pulse $G_2$. Therefore, the first to third detection signals $S_1$ to $S_3$ are read out by the voltage detection means $26_1$ to $26_3$ of each pixel circuit 13 and output to the computing circuit 12 (a voltage detection step).

Next, the computing circuit 12 calculates distance information for each pixel on the basis of the detection signals $S_1$ to $S_3$ output from each pixel circuit 13 (a distance calculation step). That is, the distance data validity determination signal generation means 33 calculates the value of the distance data validity determination signal $S_A$ using Equation (1) below:

$$S_A = S_2 + S_3 - 2S_1 \quad (1)$$

on the basis of the detection signals $S_1$ to $S_3$. In Equation (1) above, signal values (voltage values) indicated by the detection signals $S_1$ to $S_3$ are directly shown by symbols $S_1$ to $S_3$ (the same applies hereinafter). The value of the distance data validity determination signal $S_A$ is a value obtained by removing a component of the charge amount $N_B$ caused by noise such as background light and a dark current from the sum of the values of the detection signals $S_2$ and $S_3$, and is a sum of components of the detection signals $S_1$ to $S_3$ that reflect the incident pulsed light $L_R$. The distance data validity determination means 34 determines whether the calculation of the distance using the detection signals $S_1$ to $S_3$ is valid by comparing the value of the distance data validity determination signal $S_A$ with the threshold value $Th_1$. Accordingly, it is determined that a range from a value between "−1" and "0" of the delay time $T_D$ to a value between "1" and "2" of the delay time $T_D$ is a "valid data range" in which the calculation of the distance is valid, as illustrated in a part (k) of FIG. 3. Further, the distance calculation reference signal generation means 36 calculates a difference value $S_{1-3}$ between the detection signals $S_1$ and $S_3$ using Equation (2) below:

$$S_{3-1} = S_3 - S_1 \quad (2)$$

and then, calculates a value of the distance calculation reference signal $X_R$ using Equation (3) below:

$$X_R = S_{3-1}/S_A \quad (3)$$

by calculating a ratio of the difference value $S_{3-1}$ to the value of the distance data validity determination signal $S_A$.

Next, the distance calculation reference signal selection means 37 determines whether or not the value of the distance calculation reference signal $X_R$ is within a predetermined range, thereby determining whether the target S is within a measurement possibility range. For example, the distance calculation reference signal selection means 37 determines whether or not the value of the distance calculation reference signal $X_R$ is equal to or greater than "0" and equal to or smaller than the threshold value $Th_2$. Using such a determination, a case in which the target S is too close, the incident pulsed light $L_R$ deviates from a time window of the detection signal $S_2$, and the value of the distance calculation reference signal $X_R$ is saturated, and a case in which the target S is too far, the incident pulsed light $L_R$ deviates from the time window of the detection signal $S_3$, and the distance is not reflected in the value of the distance calculation reference signal $X_R$ can be excluded from the distance calculation. In the example illustrated in a part (1) of FIG. 3, a range from "0" to about "1" of the delay time $T_D$ is determined to be the "measurement possibility range". Lastly, when the range is determined to be within the "valid data range" and the target S is determined to be within the "measurement possibility range", the distance image generation means 38 calculates distance information indicating the distance to the target S on the basis of the distance calculation reference signal $X_R$ regarding the pixel, and generates and outputs a distance image including the calculated distance information of each pixel. Such generation of the distance image is repeated every period of one frame.

Figure 4:
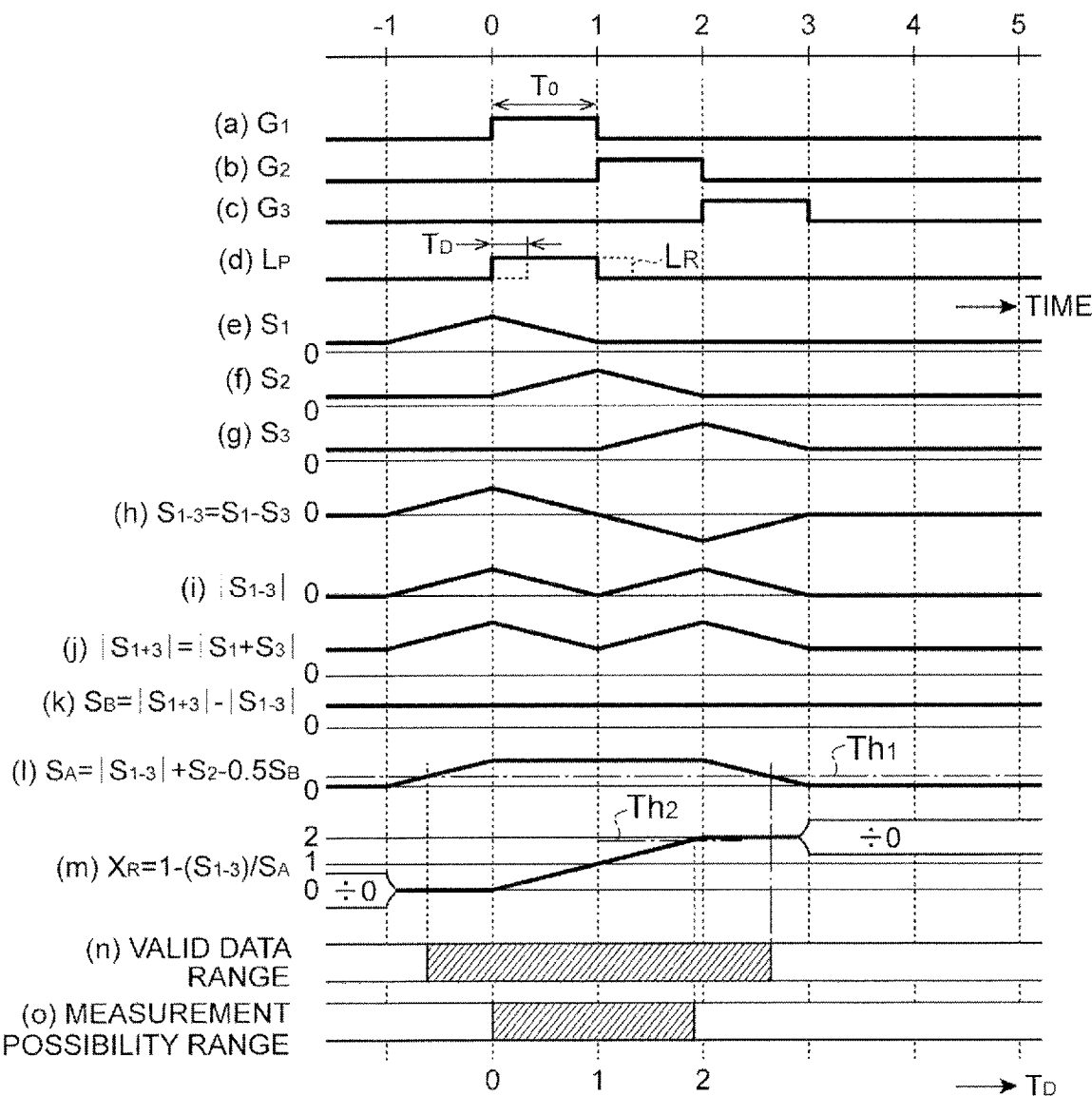
FIG. 4 is a timing chart of various signals that are handled in another calculation procedure by the distance image sensor 10 in FIG. 1 and a graph showing changes in various values calculated in another calculation procedure by the distance image sensor 10 with respect to the delay time $T_D$.

The distance calculation in the distance image sensor 10 described above is performed in the following other procedure (hereinafter also referred to as a "3-tap 2-zone scheme"). According to this procedure, it is possible to widen the "valid data range" and the "measurement possibility range" in the delay time $T_D$. FIG. 4 is a graph showing a timing chart of various signals that are handled in another calculation procedure in the distance image sensor 10 and changes in various values calculated in another calculation procedure with respect to the delay time $T_D$. In FIG. 4, timings of the control pulses $G_1$ to $G_3$ and the pulsed light $L_P$ are illustrated in parts (a) to (d), respectively. Values of the first to third detection signal $S_1$ to $S_3$, a value of the difference value $S_{1-3}$, an absolute value $|S_{1-3}|$ of the difference value, an absolute value $|S_{1+3}|$ of the sum value, a value of a signal component $S_B$ caused by noise, the value of the distance data validity determination signal $S_A$, and the value of the distance calculation reference signal $X_R$ are illustrated in correspondence to the delay time $T_D$ are illustrated in parts (e) to (m), respectively. The valid data range in the delay time $T_D$ is illustrated in a part (n). The measurement possibility range in the delay time $T_D$ is illustrated in a part (o).

First, when a distance image generation process is started by the distance image sensor 10, the light source control means 31 and the charge transfer control means 32 of the computing circuit 12 control timings of the control pulses $G_1$ to $G_3$ and the pulsed light $L_P$ within a period of one frame (a light source control step and a charge transfer control step). Specifically, the control pulses $G_1$ to $G_3$ are set at continuous timings so that the control pulses $G_1$ to $G_3$ do not overlap each other in the duration $T_1 = T_0$, and the timing of the pulsed light $L_P$ is set to substantially overlap the timing of the control pulse $G_1$. Therefore, the first to third detection signals $S_1$ to $S_3$ are read out by the voltage detection means $26_1$ to $26_3$ of each pixel circuit 13 and output to the computing circuit 12 (a voltage detection step).

Next, the computing circuit 12 calculates distance information for each pixel on the basis of the detection signals $S_1$ to $S_3$ output from each pixel circuit 13 (a distance calculation step). That is, the distance data validity determination signal generation means 33 calculates the difference value $S_{1-3}$ of the detection signals $S_1$ and $S_3$ using Equation (4) below:

$$S_{1-3} = S_1 - S_3 \quad (4)$$

on the basis of the detection signals $S_1$ and $S_3$, and then calculates the absolute value $|S_{1-3}|$ of the difference value. In addition, the distance data validity determination signal generation means 33 calculates the absolute value $|S_{1+3}|$ of the sum value of the detection signals $S_1$ and $S_3$ using Equation (5) below:

$$|S_{1+3}| = |S_1 + S_3| \quad (5)$$

and then obtains a difference between the absolute value $|S_{1+3}|$ of the sum value and the absolute value $|S_{1-3}|$ of the difference value to calculate the value of the signal component $S_B$ caused by noise using Equation (6) below:

$$S_B = |S_{1+3}| - |S_{1-3}| \quad (6).$$

Further, the distance data validity determination signal generation means 33 calculates the value of the distance data validity determination signal $S_A$ using Equation (7) below:

$$S_A = |S_{1-3}| + S_2 - 0.5 S_B \quad (7)$$

on the basis of the detection signals $S_1$ to $S_3$ and the value of the signal component $S_B$. The distance data validity determination means 34 determines whether the calculation of the distance using the detection signals $S_1$ to $S_3$ is valid by comparing the value of the distance data validity determination signal $S_A$ with the threshold value $Th_1$. For example, by setting the threshold value $Th_1$ to about "0", it is determined that a range from a value between "−1" and "0" to a value between "2" and "3" of the delay time $T_D$ is a "valid data range" in which the calculation of the distance is valid, as illustrated in a part (n) of FIG. 4. Further, the distance calculation reference signal generation means 36 calculates a ratio of the difference value $S_{1-3}$ between the detection signals $S_1$ and $S_3$ to the value of the distance data validity determination signal $S_A$ to calculate a value of the distance calculation reference signal $X_R$ using Equation (8) below:

$$X_R = 1 - S_{1-3}/S_A \quad (8).$$

Then, the distance calculation reference signal selection means 37 determines whether or not the value of the distance calculation reference signal $X_R$ is within a predetermined range, thereby determining whether the target S is within a measurement possibility range. For example, the distance calculation reference signal selection means 37 determines whether or not the value of the distance calculation reference signal $X_R$ is equal to or greater than "0" and equal to or smaller than the threshold value $Th_2$. Using such a determination, a case in which the target S is too close, the incident pulsed light $L_R$ deviates from a time window of the detection signal $S_2$, and the value of the distance calculation reference signal $X_R$ is saturated, and a case in which the target S is too far, the incident pulsed light $L_R$ deviates from the time window of the detection signal $S_2$, and the distance is not reflected in the value of the distance calculation reference signal $X_R$ can be excluded from the distance calculation. For example, a range from "0" to about "2" of the delay time $T_D$ is determined to be within the "measurement possibility range", as illustrated in a part (o) of FIG. 4, by setting the threshold value $Th_2$ to about "2". Lastly, when the range is determined to be within the "valid data range" and the target S is determined to be within the "measurement possibility range", the distance image generation means 38 calculates distance information indicating the distance to the target S on the basis of the distance calculation reference signal $X_R$ regarding the pixel, and generates and outputs a distance image including the calculated distance information of each pixel. Such generation of the distance image is repeated every period of one frame.

According to the procedure described above, since the amount of charge generated by the incident pulsed light $L_R$ can be distributed to three time windows corresponding to the detection signals $S_1$ to $S_3$, it is possible to widen a range in which the delay time $T_D$ can be calculated.

According to the distance image sensor 10 or the distance image measuring method using the distance image sensor 10 described above, the pulsed light $L_P$ is repeatedly generated from the light source 11 within the period of one frame, the time window with the duration $T_1$ equal to or longer than the duration $T_0$ of the pulsed light $L_P$ is sequentially set in correspondence to the generation of the pulsed light $L_P$, and the charge is sequentially transferred from the photoelectric conversion region 21 of the pixel circuit 13 to the first to third charge readout regions $22_1$ to $22_3$ in the time window. Further, the first to third detection signals $S_1$ to $S_3$ are read out from the first to third charge readout regions $22_1$ to $22_3$ of the pixel circuit 13, a sum value $S_A$ of the signal components of the charge generated from the incident pulsed light $L_R$ other than the background light in the first to third detection signals $S_1$ to $S_3$ is calculated on the basis of the first to third detection signals $S_1$ to $S_3$, and a determination is made as to whether the distance calculation using the first to third detection signals $S_1$ to $S_3$ is valid on the basis of a result of comparison between the sum value $S_A$ of the signal components and the threshold value $Th_1$. As a result, it is possible to generate a distance image in which a result of the valid distance calculation has been reflected by using a result of the determination, and to generate a highly accurate image signal regardless of the position of the target S.

In the embodiment, the computing circuit 12 calculates a ratio of the difference between two detection signals among the first to third detection signals $S_1$ to $S_3$ and the sum value $S_A$ of the signal components to obtain the distance calculation reference signal $X_R$, determines whether or not the distance calculation reference signal $X_R$ is valid according to a comparison result between the distance calculation reference signal $X_R$ and the threshold value $Th_2$, and calculates the distance on the basis of the distance calculation reference signal $X_R$ when the distance calculation reference signal $X_R$ is valid. By performing such a process, it is possible to appropriately determine whether or not the target S is located outside the measurement possibility range, and to generate a distance image including highly accurate distance information on the basis of a result of the determination result.

Hereinafter, measurement results in the embodiment are shown.

Figure 5:
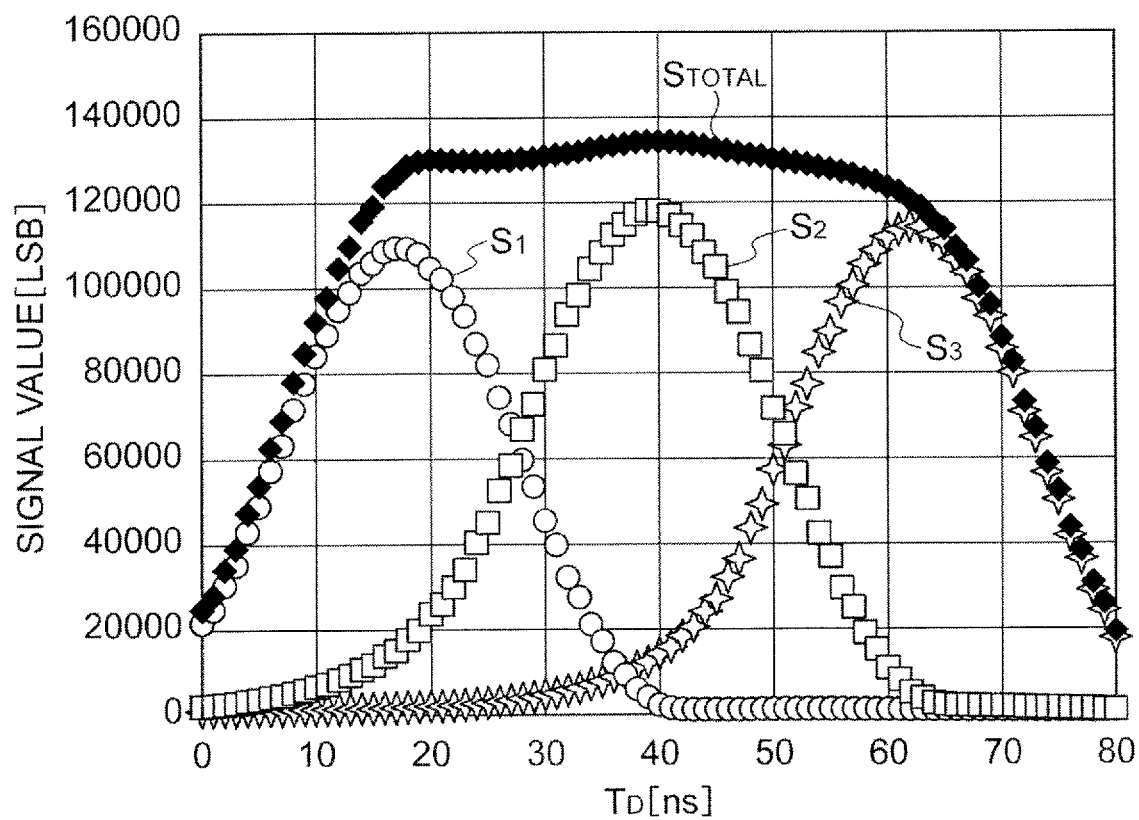
FIG. 5 is a graph showing first to third detection signals $S_1$ to $S_3$ detected in correspondence to a delay time $T_D$ of incident pulsed light $L_R$ by the distance image sensor 10 in FIG. 1, and an intensity of a sum value $S_{TOTAL}$ of these signals.

FIG. 5 illustrates the first to third detection signals $S_1$ to $S_3$ detected in correspondence to the delay time $T_D$ of the incident pulsed light $L_R$ by the distance image sensor 10, and an intensity of a sum value $S_{TOTAL}$ of these signals. Here, the 3-tap 2-zone scheme illustrated in FIG. 4 is adopted, and the duration $T_0$ of the pulsed light $L_P$ and the duration $T_1$ of the control pulses $G_1$ to $G_3$ are both set to 22.22 [ns]. It can be seen from the measurement results that peaks of the detection signals $S_1$ to $S_3$ appear at different delay times $T_D$, and the detection signals $S_1$ to $S_3$ in which the charge amount distributed according to the delay times $T_D$ has been reflected are generated.

Figure 6:
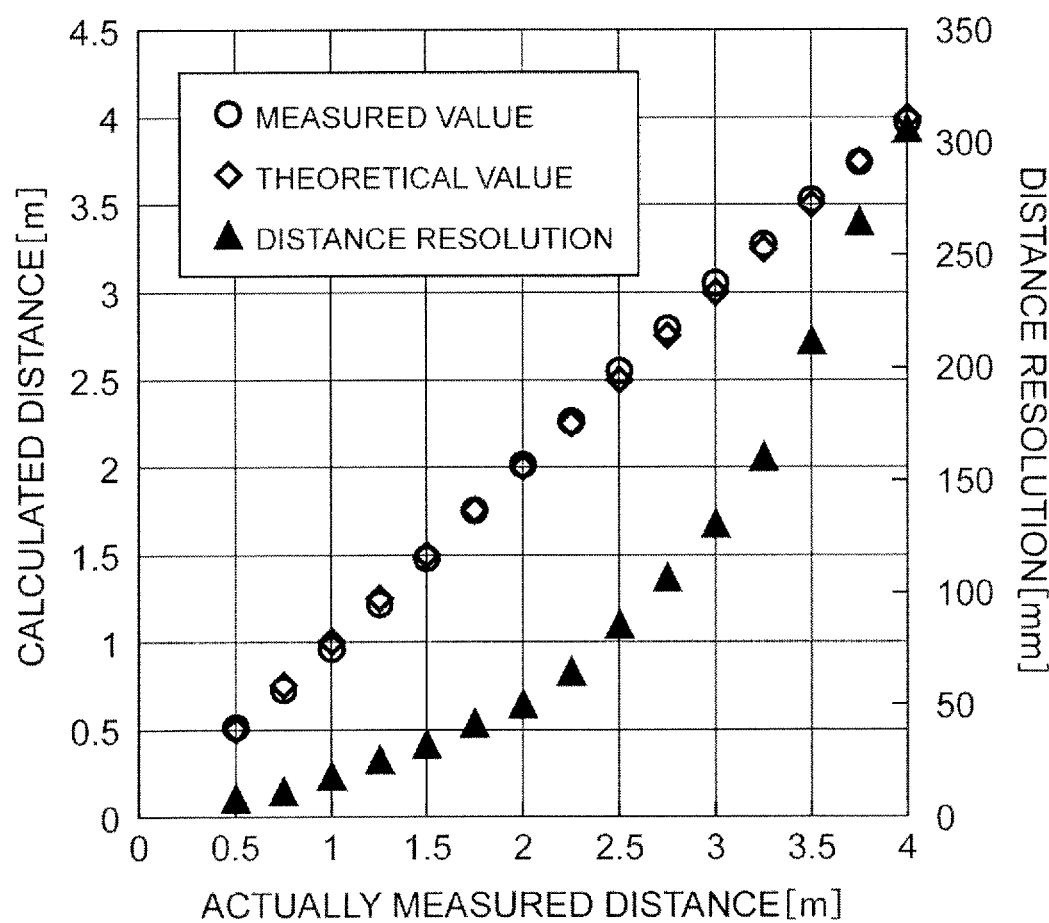
FIG. 6 is a graph showing a distance measured by the distance image sensor 10 in FIG. 1 and a distance resolution for each actually measured distance to a target S.

Further, FIG. 6 illustrates a graph showing the distance and a distance resolution measured by the distance image sensor 10 for each actually measured distance to the target S. In this case, the duration $T_0$ of the pulsed light $L_P$ was set to 28 ns, the duration $T_1$ of the control pulses $G_1$ to $G_3$ was set to 29.63 ns, and a distance image was generated at an interval of 30 fps using the 3-tap 1-zone scheme illustrated in FIG. 3. Further, measurement results of the distance and the distance resolution were averaged over 30 distance images. It was seen from this measurement result that the measured distance value was well matched with the actually measured distance in a range of 0.5 m to 4 m, and the distance resolution was increased to 50 mm or less at a measured distance value of 2 m.

Figure 7:
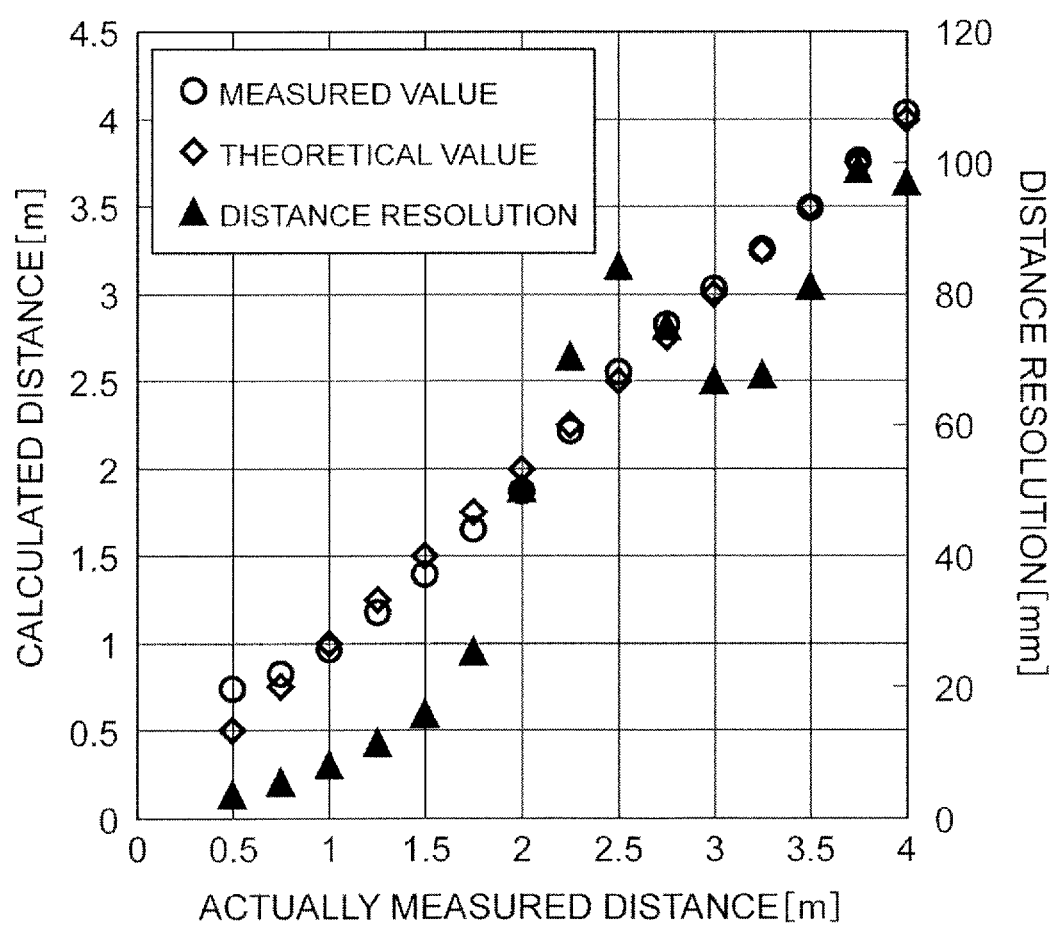
FIG. 7 is a graph showing a distance measured by the distance image sensor 10 in FIG. 1 and a distance resolution for each actually measured distance to a target S.

Similarly, FIG. 7 illustrates a graph showing the distance and a distance resolution measured by the distance image sensor 10 for each actually measured distance to the target S. In this case, the duration $T_0$ of the pulsed light $L_P$ was set to 14 ns, the duration $T_1$ of the control pulses $G_1$ to $G_3$ was set to 14.82 ns, and a distance image was generated at an interval of 30 fps by adopting the 3-tap 2-zone scheme. It was seen from this measurement result that the measured distance value was well matched with the actually measured distance in a range of 0.5 m to 4 m, and the distance resolution was increased to 20 mm or less at the measured distance value of 1.5 m.

Figure 8:
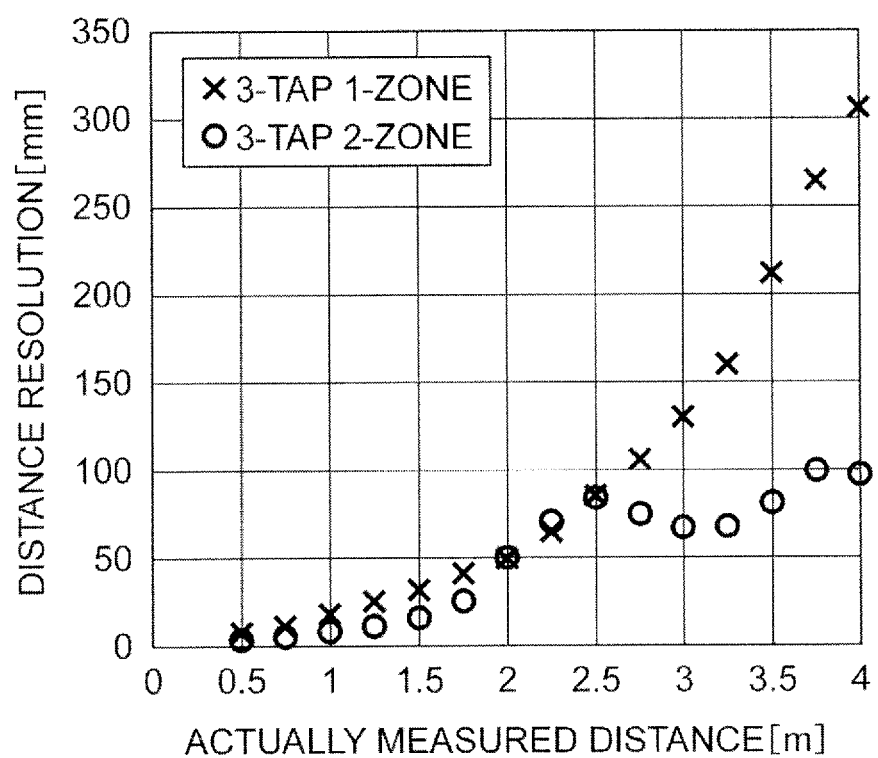
FIG. 8 is a graph showing characteristics of a distance resolution in distance calculation performed by the distance image sensor 10 in FIG. 1.

FIG. 8 illustrates a graph showing characteristics of the distance resolution in the distance calculation executed using the 3-tap 1-zone scheme or the 3-tap 2-zone scheme by the distance image sensor 10. As shown in the characteristics, the distance resolution tends to gradually decrease as a measurement distance becomes longer in the case of the 3-tap 1-zone scheme, whereas in the case of the 3-tap 2-zone scheme, the distance resolution increases in a wide range of the distance to be calculated.

Figure 9:
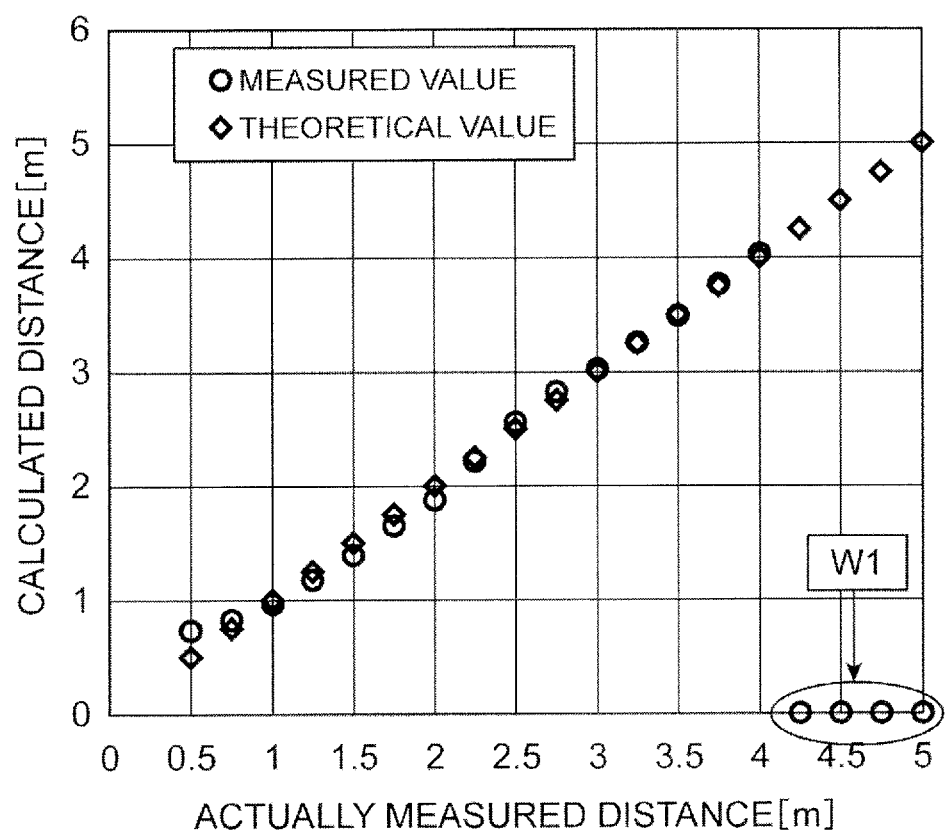
FIG. 9 is a graph showing a distance measured by the distance image sensor 10 in FIG. 1 through comparison with an actually measured distance.

FIG. 9 illustrates the distance calculated by adopting the 3-tap 2-zone scheme by the distance image sensor 10 of FIG. 1 through comparison with the actually measured distance. Thus, the calculated distance is well matched with the actually measured distance in a range in which the actually measured distance ranges up to 4 m. When the actually measured distance exceeds 4 m (a range indicated by reference sign W1 in FIG. 9), the target S is located outside the measurement possibility range, such that the calculated distance is close to 0 and an error of the distance calculation using the detection signals $S_1$ to $S_3$ increases. However, in this case, the distance calculation is invalidated through a threshold value determination, thereby preventing generation of an erroneous distance image.

Second Embodiment

Next, a configuration of a distance image sensor 10A according to the second embodiment of the present invention and a procedure of a distance image measuring method using the distance image sensor 10A will be described.

Figure 10:
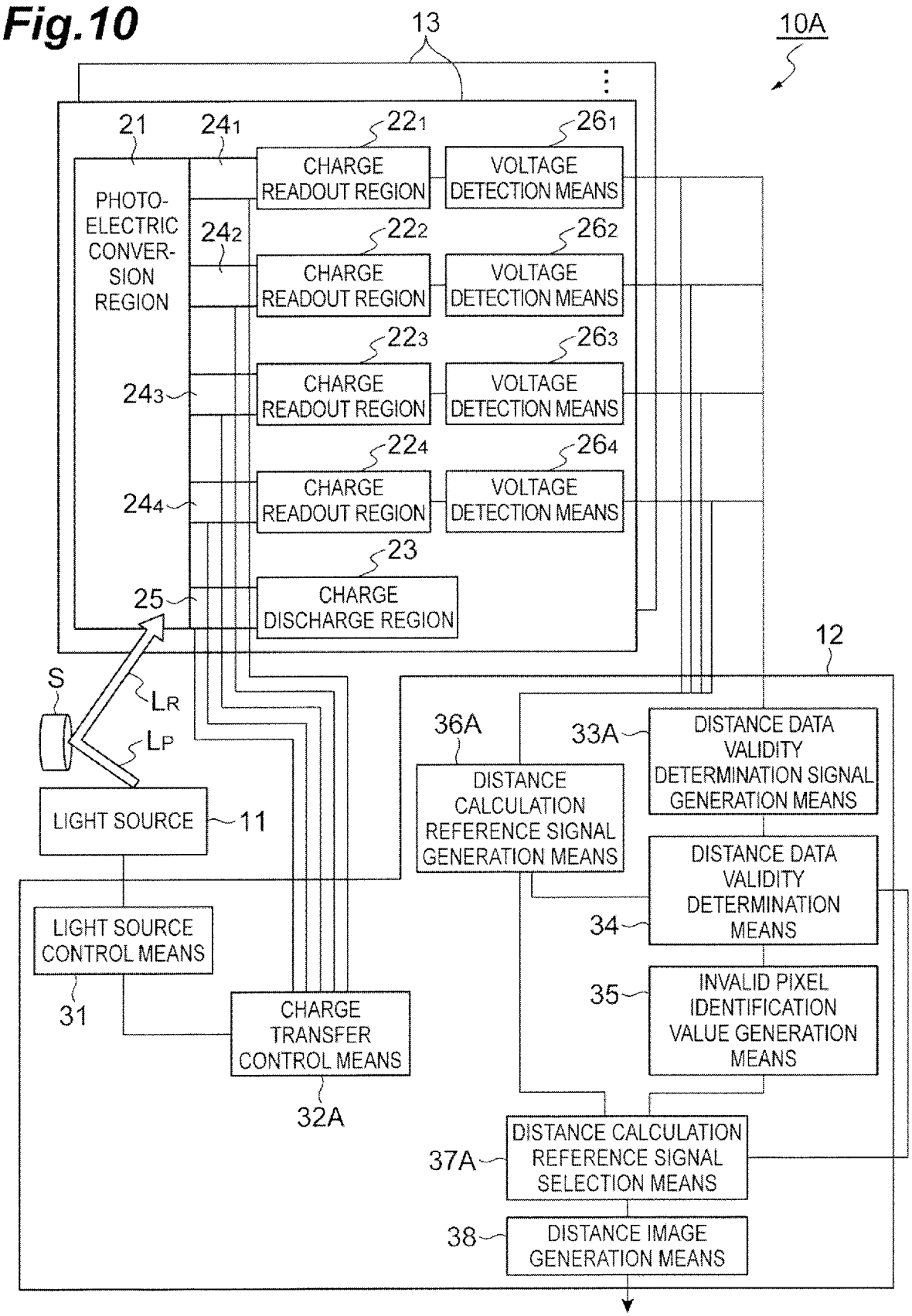
FIG. 10 is a block diagram illustrating a schematic configuration of a distance image sensor 10A according to a second embodiment of the present invention.

FIG. 10 is a block diagram illustrating a schematic configuration of the distance image sensor 10A. The distance image sensor 10A illustrated in FIG. 10 is different from the distance image sensor 10 according to the first embodiment in that the pixel circuit 13 includes four charge readout regions $22_1$ to $22_4$, and includes four control electrodes $24_1$ to $24_4$ and four voltage detection means $26_1$ to $26_4$ in correspondence thereto, and that a charge transfer control means 32A, and a distance data validity determination signal generation means 33A, a distance calculation reference signal generation means 36A, and a distance calculation reference signal selection means 37A, constituting a distance calculation means, have different functions. Hereinafter, a configuration of the distance image sensor 10A will be described while focusing on differences from the distance image sensor 10.

The pixel circuit 13 includes first to fourth charge readout regions $22_1$ to $22_4$ and a charge discharge region 23 provided in proximity to the photoelectric conversion region 21 and apart from each other, first to fourth control electrodes $24_1$ to $24_4$ and a control electrode 25 provided in correspondence to the first to fourth charge readout regions $22_1$ to $22_4$ and the charge discharge region 23, for applying a control pulse for charge transfer between the photoelectric conversion region 21 and the respective region, and voltage detection means $26_1$ to $26_4$ for reading out first to fourth detection signals $S_1$ to $S_4$ from the first to fourth charge readout regions $22_1$ to $22_4$. A specific circuit configuration of the charge readout regions $22_1$ to $22_4$, and forms of various regions and control electrodes in the pixel circuit 13 are the same as those in the first embodiment.

The charge transfer control means 32A of the computing circuit 12 sequentially applies the first to fourth control pulses $G_1$ to $G_4$ to the control electrodes $24_1$ to $24_4$ only during the duration $T_1$ that is equal to or longer than the duration $T_0$ in correspondence to the respective light emission timings of the pulsed light $L_P$ within a period of one frame. In the embodiment, the duration $T_1$ is set to be equal to the duration $T_0$. Further, the charge transfer control means 32A applies, to the control electrode 25, the control pulse $G_D$ for discharging the charge accumulated in the photoelectric conversion region 21 to the charge discharge region 23 before a series of application timings of the first to fourth control pulses $G_1$ to $G_4$.

The distance data validity determination signal generation means 33A of the computing circuit 12 generates, as the distance data validity determination signal $S_A$, a sum value of the signal components of the charge generated from the incident pulsed light $L_R$ other than signal components of the background light in the first to fourth detection signals $S_1$ to $S_4$ output from the pixel circuit 13 on the basis of the first to fourth detection signals $S_1$ to $S_4$. The distance calculation reference signal generation means 36A calculates a ratio between a difference value $S_{1-3}$ of one set of the detection signals $S_1$, $S_3$ among the detection signals $S_1$ to $S_4$ and the distance data validity determination signal $S_A$ to obtain a first distance calculation reference signal $X_R$. In addition, the distance calculation reference signal generation means 36A calculates a ratio between a difference value $S_{2-4}$ of the other set of the detection signals $S_2$, $S_4$ among the first to fourth detection signals $S_1$ to $S_4$ and the distance data validity determination signal $S_A$ to obtain a second distance calculation reference signal $Y_R$. The distance calculation reference signal generation means 36A selects any one of the first and second distance calculation reference signals $X_R$ and $Y_R$ according to a result of comparison between the first obtained distance calculation reference signal $X_R$ and a threshold value (a third threshold value) $Th_2$, and outputs the selected distance calculation reference signal $X_R$ or $Y_R$ as a valid value to the distance image generation means 38 when the first or second selected distance calculation reference signals $X_R$ or $Y_R$ is within a measurement possibility range.

Figure 11:
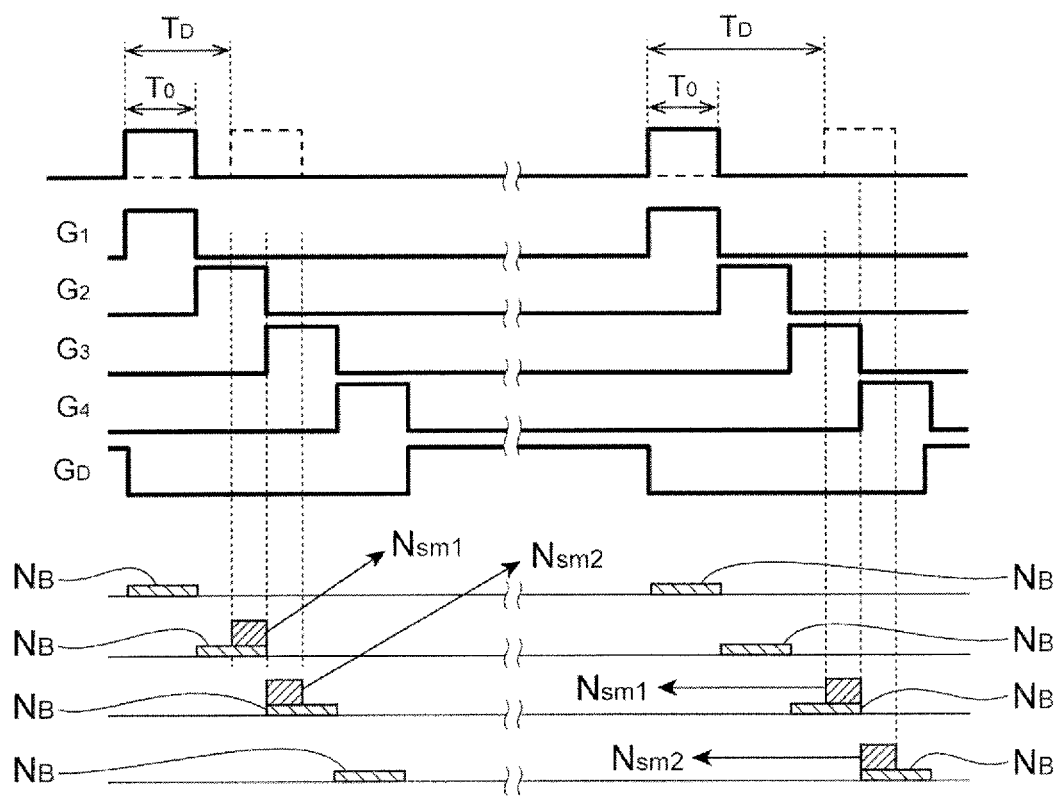
FIG. 11 is a timing chart for explaining a principle of distance calculation by the distance image sensor 10A in FIG. 10.

FIG. 11 is a timing chart for explaining a principle of distance calculation in the distance image sensor 10A. In FIG. 11, timings of various signals that are controlled by the distance image sensor 10A and timings at which charge is accumulated in the respective regions of the pixel circuit 13 are illustrated, and the light emission timing of the pulsed light $L_P$, application timings of the first to fourth control pulses $G_1$ to $G_4$ and the control pulse $G_D$, and charge accumulation timings in the first to fourth charge readout regions $22_1$ to $22_4$ are illustrated in this order from top. Thus, the first to fourth control pulses $G_1$ to $G_4$ are applied with the duration $T_0$ not to overlap each other according to a light emission timing with the duration $T_0$ of the pulsed light $L_P$. Accordingly, the charge accumulated in the photoelectric conversion region 21 due to photoelectric conversion of the incident pulsed light $L_R$ is distributed to the two charge readout regions $22_2$ and $22_3$ or the two charge readout regions $22_3$ and $22_4$ at a ratio corresponding to the delay time $T_D$ of the incident pulsed light $L_R$ with respect to the pulsed light $L_P$. Here, by setting a relationship between the light emission timing with the duration $T_D$ of the pulsed light $L_R$ and the application timing of the first control pulse $G_1$, only a charge amount $N_B$ of charge caused by noise such as background light and a dark current is transferred to the charge readout region $22_1$ in a time window defined by the control pulse $G_1$. On the other hand, when an arrival timing of the incident pulsed light $L_R$ extends over two time windows defined by the control pulses $G_2$ and $G_3$, charge obtained by adding a charge amount $N_{sm1}$ distributed corresponding to the delay time $T_D$ to the charge amount $N_B$ is transferred to the charge readout region $22_2$, and charge obtained by adding a charge amount $N_{sm2}$ distributed corresponding to the delay time $T_D$ to the charge amount $N_B$ is transferred to the charge readout region $22_3$. On the other hand, when an arrival timing of the incident pulsed light $L_R$ extends over two time windows defined by the control pulses $G_3$ and $G_4$, charge obtained by adding a charge amount $N_{sm1}$ distributed corresponding to the delay time $T_D$ to the charge amount $N_B$ is transferred to the charge readout region $22_3$, and charge obtained by adding a charge amount $N_{sm2}$ distributed corresponding to the delay time $T_D$ to the charge amount $N_B$ is transferred to the charge readout region $22_4$. Using such a phenomenon, in the computing circuit 12 of the distance image sensor 10A, it is possible to calculate the distance to the target S corresponding to the delay time $T_D$ by calculating a ratio between the charge amount $N_{sm1}$ excluding the charge amount $N_B$ and the charge amount $N_{sm2}$ excluding the charge amount $N_B$ according to the respective light emission timings of the pulsed light $L_P$.

Figure 12:
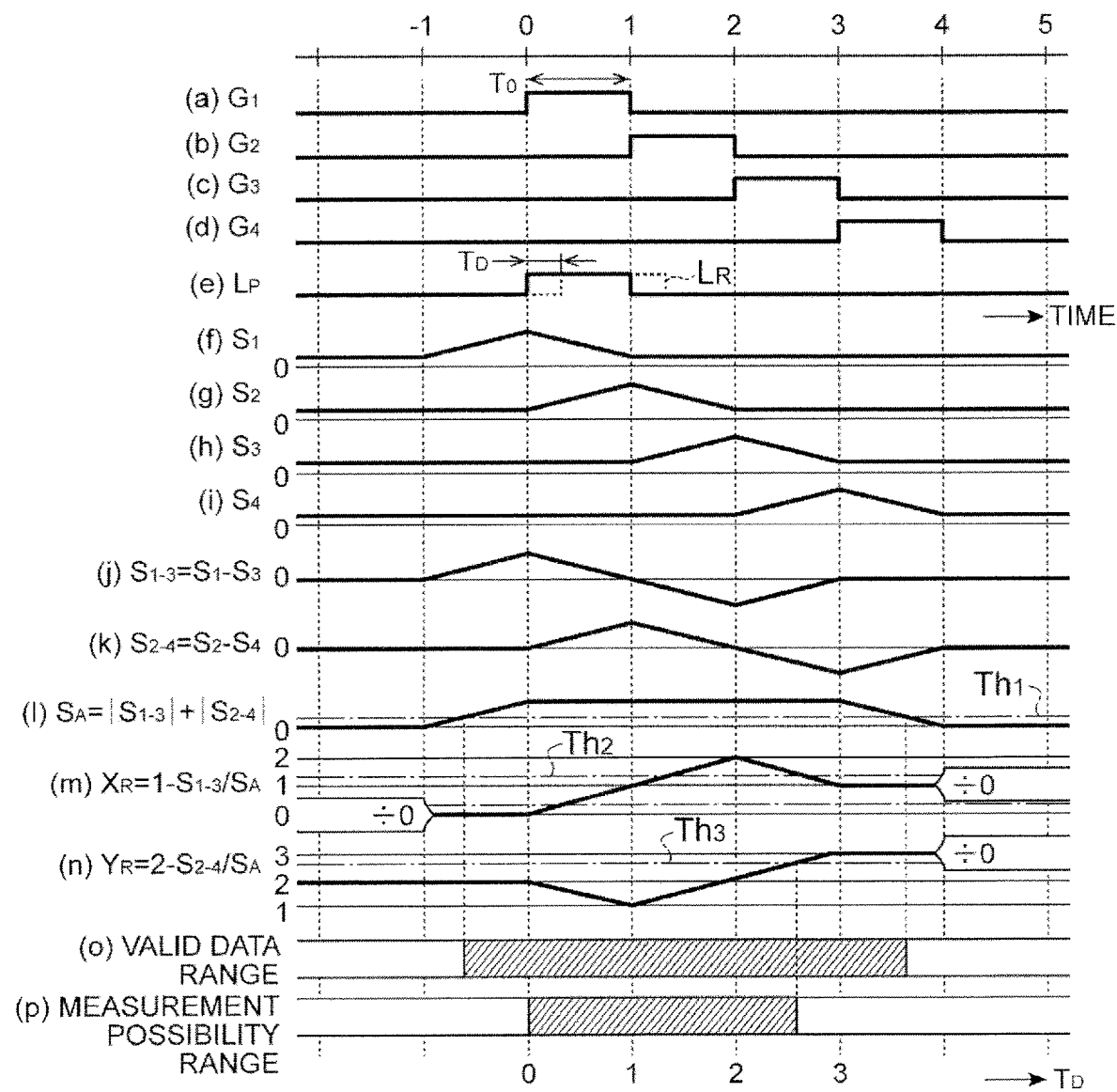
FIG. 12 is a timing chart of various signals that are handled by the distance image sensor 10A in FIG. 10 and a graph showing changes in various values calculated by the distance image sensor 10A with respect to a delay time $T_D$.

Next, details of a distance calculation procedure in the distance image sensor 10A will be described, and a distance image measuring method according to the embodiment (hereinafter also referred to as a "4-tap 3-zone scheme") will be described. FIG. 12 is a graph showing a timing chart of various signals that are handled by the distance image sensor 10A and changes in various calculated values with respect to a delay time $T_D$. In FIG. 12, timings of the control pulses $G_1$ to $G_4$ and the pulsed light $L_P$ are illustrated in parts (a) to (e), respectively. Values of the first to fourth detection signal $S_1$ to $S_4$, values of the difference value $S_{1-3}$ and $S_{2-4}$, the value of the distance data validity determination signal $S_A$, and the values of the distance calculation reference signals $X_R$ and $Y_R$ are illustrated in correspondence to the delay time $T_D$ in parts (f) to (n), respectively. The valid data range in the delay time $T_D$ is illustrated in a part (o). The measurement possibility range in the delay time $T_D$ is illustrated in a part (p).

First, when a distance image generation process is started by the distance image sensor 10A, the light source control means 31 and the charge transfer control means 32A of the computing circuit 12 control timings of the control pulses $G_1$ to $G_4$ and the pulsed light $L_P$ within a period of one frame (a light source control step and a charge transfer control step). Specifically, the control pulses $G_1$ to $G_4$ are set at continuous timings so that the control pulses $G_1$ to $G_4$ do not overlap each other in the duration $T_1=T_0$, and the timing of the pulsed light $L_P$ is set to substantially overlap the timing of the control pulse $G_1$. Therefore, the first to fourth detection signals $S_1$ to $S_4$ are read out by the voltage detection means $26_1$ to $26_4$ of each pixel circuit 13 and output to the computing circuit 12 (a voltage detection step).

Next, the computing circuit 12 calculates distance information for each pixel on the basis of the detection signals $S_1$ to $S_4$ output from each pixel circuit 13 (a distance calculation step). That is, the distance data validity determination signal generation means 33A calculates the difference value $S_{1-3}$ of the detection signals $S_1$ and $S_3$ using Equation (9) below:

$$S_{1-3}=S_1-S_3 \qquad (9)$$

on the basis of the detection signals $S_1$ and $S_3$, and then calculates the absolute value $|S_{1-3}|$ of the difference value. In addition, the distance data validity determination signal generation means 33A calculates the difference value $S_{2-4}$ of the detection signals $S_2$ and $S_4$ using Equation (10) below:

$$S_{2-4}=S_2-S_4 \qquad (10)$$

on the basis of the detection signals $S_2$ and $S_4$, and then calculates the absolute value $|S_{2-4}|$ of the difference value. Further, the distance data validity determination signal generation means 33A calculates the value of the distance data validity determination signal $S_A$ using Equation (11) below:

$$S_A=|S_{1-3}|+|S_{2-4}| \qquad (11)$$

by summing the absolute value $|S_{1-3}|$ of the difference value and the absolute value $|S_{2-4}|$ of the difference value. The distance data validity determination means 34 determines whether or not the calculation of the distance using the detection signals $S_1$ to $S_4$ is valid by comparing the value of the distance data validity determination signal $S_A$ with the threshold value $Th_1$. For example, by setting the threshold value $Th_1$ to about "0", it is determined that a range from a value between "−1" and "0" to a value between "3" and "4" of the delay time $T_D$ is a "valid data range" in which the calculation of the distance is valid, as illustrated in a part (o) of FIG. 12. Further, the distance calculation reference signal generation means 36A calculates a ratio of the difference value $S_{1-3}$ between the detection signals $S_1$ and $S_3$ to the value of the distance data validity determination signal $S_A$ to calculate a value of the first distance calculation reference signal $X_R$ using Equation (12) below:

$$X_R=1-S_{1-3}/S_A \qquad (12),$$

and calculates a ratio of the difference value $S_{2-4}$ between the detection signals $S_2$ and $S_4$ to the value of the distance data validity determination signal $S_A$ to calculate a value of the second distance calculation reference signal $Y_R$ using Equation (13) below:

$$X_R = 2 - S_{2-4}/S_A \qquad (13).$$

Next, the distance calculation reference signal selection means 37A determines whether or not the value of the distance calculation reference signal $X_R$ is within a predetermined range, such that a value to be referred for distance calculation is selected from the distance calculation reference signal $X_R$ and the distance calculation reference signal $X_R$. For example, when the value of the distance calculation reference signal $X_R$ is equal to or greater than "0" and equal to or smaller than the threshold value $Th_2$, the distance calculation reference signal $X_R$ is selected, and when the value of the distance calculation reference signal $X_R$ exceeds the threshold value $Th_2$, the distance calculation reference signal $Y_R$ is selected. Using such a determination, it is possible to select a distance calculation reference signal reflecting a detection signal of a time window that an incidence timing of the incident pulsed light $L_R$ has overlapped according to the position of the target S. Further, the distance calculation reference signal selection means 37A determines whether or not values of the selected distance calculation reference signals $X_R$ and $Y_R$ are within a predetermined range, thereby determining whether the target S is within a measurement possibility range. For example, the distance calculation reference signal selection means 37A determines whether or not the value of the distance calculation reference signal $X_R$ is equal to or greater than "0", and determines whether or not the value of the distance calculation reference signal $Y_R$ is equal to or smaller than the threshold value $Th_3$. Using such a determination, a case in which the target S is too close, the incident pulsed light $L_R$ deviates from a time window of the detection signal $S_3$, and the value of the distance calculation reference signal $Y_R$ is saturated, and a case in which the target S is too far, the incident pulsed light $L_R$ deviates from the time window of the detection signal $S_2$, and the distance is not reflected in the value of the distance calculation reference signal $X_R$ can be excluded from the distance calculation. For example, a range from "0" to about "3" of the delay time $T_D$ is determined to be within the "measurement possibility range" as illustrated in a part (p) of FIG. 12 by setting the threshold value $Th_3$ to about "3". Lastly, when the range is determined to be within the "valid data range" and the target S is determined to be within the "measurement possibility range", the distance image generation means 38 calculates distance information indicating the distance to the target S on the basis of the selected distance calculation reference signals $X_R$ and $Y_R$ regarding the pixel, and generates and outputs a distance image including the calculated distance information of each pixel.

According to the procedure described above, since the amount of charge generated by the incident pulsed light $L_R$ can be distributed to four time windows corresponding to the detection signals $S_1$ to $S_4$, it is possible to widen a range in which the delay time $T_D$ can be calculated. Further, since a value changing linearly with respect to the delay time $T_D$ is selected from the distance calculation reference signals $X_R$ and $Y_R$ and the calculation of the distance is performed, it is possible to calculate the distance by using a value of an appropriate distance data reference signal in correspondence to a range in which the target S is located, and to generate a highly accurate image signal regardless of the position of the target S.

Figure 13:
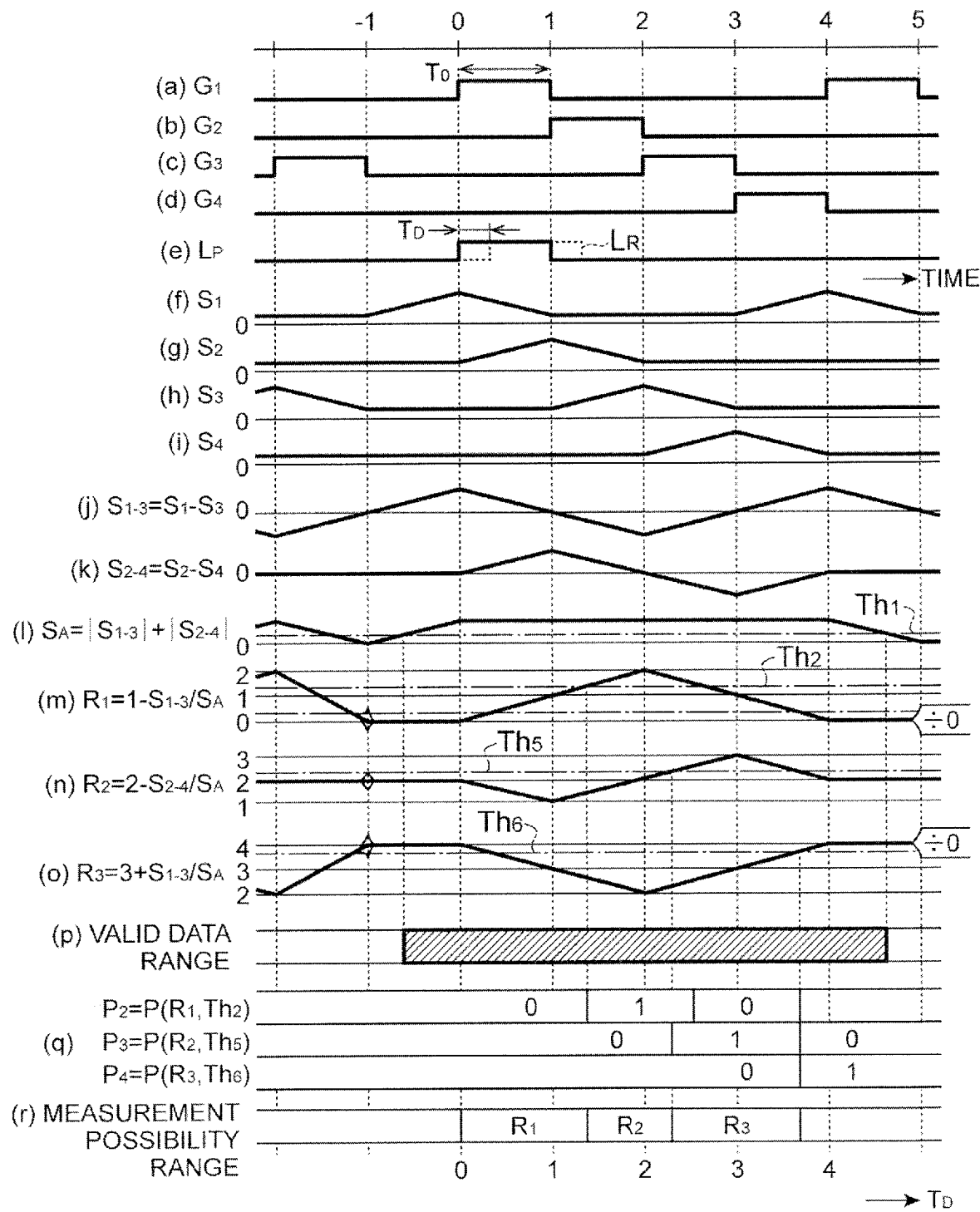
FIG. 13 is a timing chart of various signals that are handled by the distance image sensor 10A in FIG. 10 and a graph showing changes in various values calculated by the distance image sensor 10A with respect to the delay time $T_D$.

The distance calculation in the distance image sensor 10A described above may be performed in the following other procedure (hereinafter also referred to as a "4-tap 4-zone scheme"). According to this procedure, it is possible to widen the "valid data range" and the "measurement possibility range" in the delay time $T_D$. FIG. 13 is a graph showing a timing chart of various signals that are handled in another calculation procedure in the distance image sensor 10A and changes in various values calculated in another calculation procedure with respect to a delay time $T_D$. In FIG. 13, timings of the control pulses $G_1$ to $G_4$ and the pulsed light $L_P$ are illustrated in parts (a) to (e), respectively. Values of the first to fourth detection signal $S_1$ to $S_4$, values of the difference value $S_{1-3}$ and $S_{2-4}$, the value of the distance data validity determination signal $S_A$, and the values of the distance calculation reference signals $R_1$, $R_2$, and $R_3$ are illustrated in correspondence to the delay time $T_D$ in parts (f) to (o), respectively. The valid data range in the delay time $T_D$ is illustrated in a part (p). Values of comparison signals $P_2$ to $P_4$ calculated in correspondence to the delay time $T_D$ is illustrated in a part (q). The measurement possibility range in the delay time $T_D$ is illustrated in a part (r).

First, when a distance image generation process is started by the distance image sensor 10A, the light source control means 31 and the charge transfer control means 32A of the computing circuit 12 control timings of the control pulses $G_1$ to $G_4$ and the pulsed light $L_P$ within a period of one frame (a light source control step and a charge transfer control step). Specifically, the control pulses $G_1$ to $G_4$ are set at continuous timings so that the control pulses $G_1$ to $G_4$ do not overlap each other in the duration $T_1=T_0$, and the timing of the pulsed light $L_P$ is set to substantially overlap the timing of the control pulse $G_1$. Here, the control pulse $G_3$ is turned ON immediately before a light emission timing of the pulsed light $L_P$, and then, the control pulse $G_1$ is turned ON again immediately after the four control pulses $G_1$ to $G_4$ are continuously turned ON. Thereafter, the first to fourth detection signals $S_1$ to $S_4$ are read out by the voltage detection means $26_1$ to $26_4$ of each pixel circuit 13 and output to the computing circuit 12 (a voltage detection step).

Then, the computing circuit 12 calculates distance information for each pixel on the basis of the detection signals $S_1$ to $S_4$ output from each pixel circuit 13 (a distance calculation step). That is, the distance data validity determination signal generation means 33A calculates the difference value $S_{1-3}$ of the detection signals $S_1$ and $S_3$ and the difference value $S_{2-4}$ of the detection signals $S_2$ and $S_4$. In addition, the distance data validity determination signal generation means 33A calculates the value of the distance data validity determination signal $S_A$ on the basis of absolute values of the difference value $S_{1-3}$ and the difference value $S_{2-4}$. The distance data validity determination means 34A determines whether the calculation of the distance using the detection signals $S_1$ to $S_4$ is valid by comparing the value of the distance data validity determination signal $S_A$ with the threshold value $Th_1$. For example, by setting the threshold value $Th_1$ to about "0", it is determined that a range from a value between "−1" and "0" to a value between "4" and "5" of the delay time $T_D$ is a "valid data range" in which the calculation of the distance is valid, as illustrated in a part (p) of FIG. 13. Further, the distance calculation reference signal generation means 36A calculates a ratio between the difference value $S_{1-3}$ between the detection signals $S_1$ and $S_3$ and the value of the distance data validity determination signal $S_A$ to calculate a value of the first distance calculation reference signal $R_1$ using Equation (14) below:

$$R_1 = 1 - S_{1-3}/S_A \quad (14),$$

calculates a ratio between the difference value $S_{2-4}$ between the detection signals $S_2$ and $S_4$ and the value of the distance data validity determination signal $S_A$ to calculate a value of the distance calculation reference signal $R_2$ using Equation (15) below:

$$R_2 = 2 - S_{2-4}/S_A \quad (15),$$

and calculates a ratio between the difference value $S_{1-3}$ between the detection signals $S_1$ and $S_3$ and the value of the distance data validity determination signal $S_A$ to calculate a value of the distance calculation reference signal $R_3$ using Equation (16) below:

$$R_3 = 3 + S_{1-3}/S_A \quad (16).$$

The distance calculation reference signal selection means 37A compares the values of distance calculation reference signals $R_1$ to $R_3$ with a threshold value, such that a value to be referred for distance calculation is selected from the distance calculation reference signals $R_1$ to $R_3$. For example, when the distance calculation reference signal $R_1$ is equal to or smaller than the threshold value $Th_2$ and the distance calculation reference signal $R_2$ is equal to or smaller than a threshold value $Th_5$, the distance calculation reference signal $R_1$ is selected. On the other hand, when the distance calculation reference signal $R_1$ exceeds the threshold value $Th_2$ and the distance calculation reference signal $R_2$ is equal to or smaller than the threshold value $Th_5$, the distance calculation reference signal $R_2$ is selected. Further, when the distance calculation reference signal $R_2$ exceeds the threshold value $Th_5$, the distance calculation reference signal $R_3$ is selected. Using such a determination, it is possible to select a distance calculation reference signal reflecting a detection signal of a time window that an incidence timing of the incident pulsed light $L_R$ has overlapped according to the position of the target S. Further, the distance calculation reference signal selection means 37A determines whether or not values of the selected distance calculation reference signals $R_1$ and $R_3$ are within a predetermined range, thereby determining whether the target S is within a measurement possibility range. For example, the distance calculation reference signal selection means 37A determines whether or not the value of the distance calculation reference signal $R_1$ is equal to or greater than "0", and determines whether or not the value of the distance calculation reference signal $R_3$ is equal to or smaller than the threshold value $Th_6$. Using such a determination, a case in which the target S is too close, the incident pulsed light $L_R$ deviates from a time window of the detection signal $S_4$, and the value of the distance calculation reference signal $R_3$ is saturated, and a case in which the target S is too far, the incident pulsed light $L_R$ deviates from the time window of the detection signal $S_2$, and the distance is not reflected in the value of the distance calculation reference signal $R_1$ can be excluded from the distance calculation. For example, a range from "0" to about "4" of the delay time $T_D$ is determined to be within the "measurement possibility range" as illustrated in a part (r) of FIG. 13 by setting the threshold value $Th_6$ to about "4". Further, the comparison signal $P_2$ obtained as a result of comparing the distance calculation reference signal $R_1$ with the threshold value $Th_2$, the comparison signal $P_3$ obtained as a result of comparing the distance calculation reference signal $R_2$ with the threshold value $Th_5$, and the comparison signal $P_4$ obtained as a result of comparing the distance calculation reference signal $R_3$ with the threshold value $Th_6$ are illustrated in a part (q) of FIG. 13.

Lastly, when the range is determined to be within the "valid data range" and the target S is determined to be within the "measurement possibility range", the distance image generation means 38 calculates distance information indicating the distance to the target S on the basis of the distance calculation reference signals $R_1$ to $R_3$ selected regarding the pixel, and generates and outputs a distance image including the calculated distance information of each pixel.

According to the procedure described above, since the amount of charge generated by the incident pulsed light $L_R$ can be distributed to the five time windows corresponding to the five consecutive control pulses $G_1$ to $G_4$ and $G_1$, it is possible to widen a range in which the delay time $T_D$ can be calculated. Further, since a value changing linearly with respect to the delay time $T_D$ is selected from the distance calculation reference signals $R_1$, $R_2$, and $R_3$ and the calculation of the distance is performed, it is possible to calculate the distance by using a value of an appropriate distance data reference signal in correspondence to a range in which the target S is located, and to generate a highly accurate image signal regardless of the position of the target S.

Figure 14:
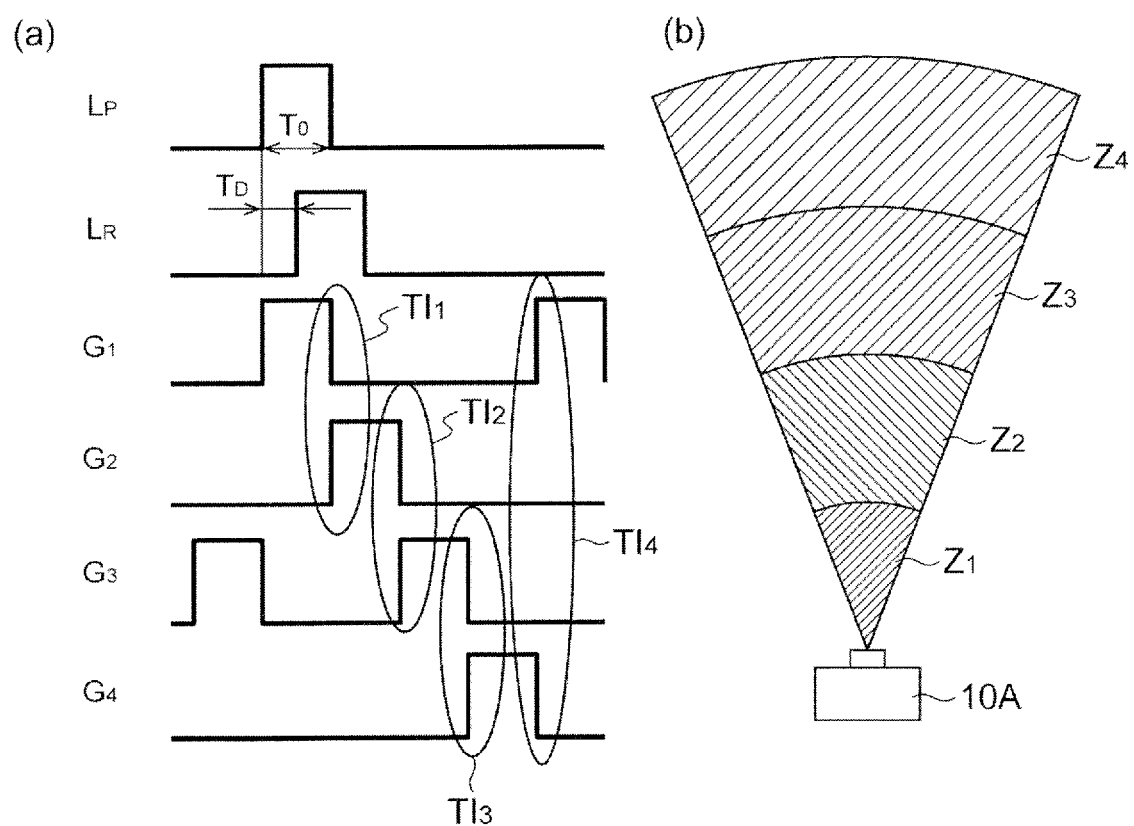
FIG. 14(a) is a timing chart of various signals that are handled in distance calculation of a 4-tap 4-zone scheme.
FIG. 14(b) is a diagram illustrating an area in which there is a target S for distance calculation.

An overview of the distance calculation procedure of the 4-tap 4-zone scheme of the embodiment will be described with reference to FIGS. 14 to 16. In FIG. 14, a part (a) illustrates a timing chart of various signals that are handled in distance calculation of the 4-tap 4-zone scheme, and a part (b) illustrates an area in which there is the target S of which the distance is calculated. Further, in FIG. 15, a timing chart of various signals that are handled in the distance calculation of the 4-tap 4-zone scheme is illustrated together with a distribution state of charge in each time window. In FIG. 16, a timing chart of various signals that are handled in the distance calculation of the 4-tap 4-zone scheme is illustrated together with a selection state of the distance calculation reference signals $R_1$, $R_2$, and $R_3$ corresponding to the delay time $T_D$.

As illustrated in FIG. 14, a timing of arrival of the incident pulsed light $L_R$ at the pixel circuit 13 differs depending on which of the zones $Z_1$ to $Z_4$ of which distances from the distance image sensor 10A are different the target S is located in. For example, when the target S is located in the zone $Z_1$ of which the distance from the distance image sensor 10A is small, the arrival timing of the incident pulsed light $L_R$ is a timing $TI_1$ across the time window defined by the control pulse $G_1$ and the time window defined by the control pulse $G_2$. Further, when the target S is located in a zone $Z_2$ of which the distance from the distance image sensor 10A is larger than that of the zone $Z_1$, the arrival timing of the incident pulsed light $L_R$ is a timing $TI_2$ across the time window defined by the control pulse $G_2$ and the time window defined by the control pulse $G_3$. Further, when the target S is located in the zone $Z_3$ of which the distance from the distance image sensor 10A is larger than that of the zone $Z_2$, the arrival timing of the incident pulsed light $L_R$ is a timing $TI_3$ across the time window defined by the control pulse $G_3$ and the time window defined by the control pulse $G_4$. Further, when the target S is located in the zone $Z_4$ of which the distance from the distance image sensor 10A is larger than that of the zone $Z_3$, the arrival timing of the incident pulsed light $L_R$ is a timing $TI_4$ across the time window defined by the control pulse $G_4$ and the time window defined by the control pulse $G_1$.

Figure 15:
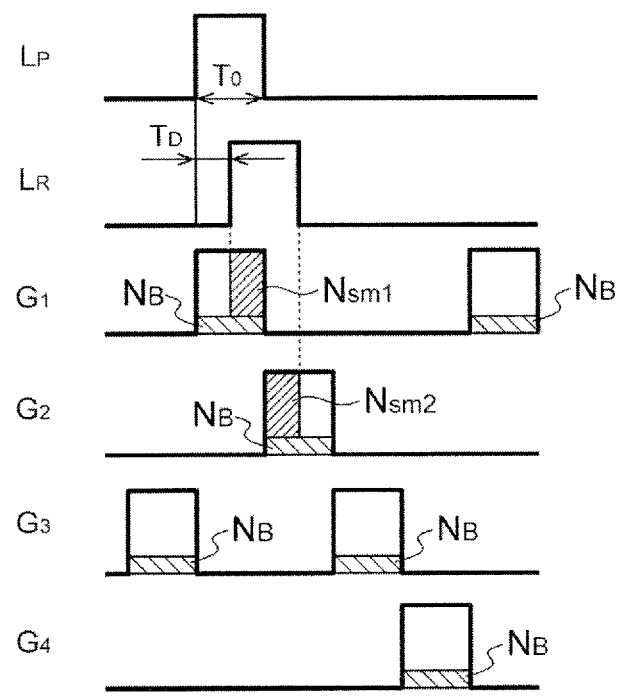
FIG. 15 is a timing chart of various signals that are handled in distance calculation of a 4-tap 4-zone scheme.
Figure 16:
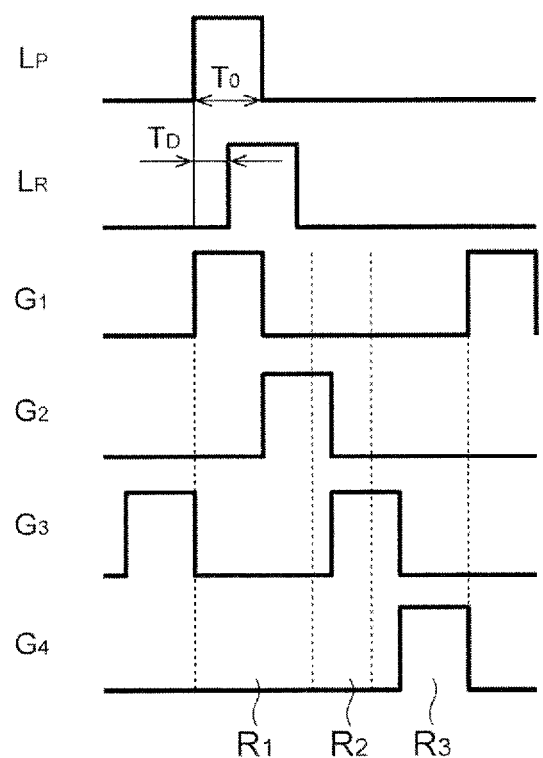
FIG. 16 is a timing chart of various signals that are handled in distance calculation of a 4-tap 4-zone scheme.

Using such a phenomenon, in the distance calculation of the embodiment, when the arrival timing of the incident pulsed light $L_R$ is the timing $TI_1$ as illustrated in FIG. 15, the distance calculation is performed by using the distance calculation reference signal $R_1$, such that a ratio between the amount $N_{sm1}$ of charge accumulated in the time window defined by the control pulse $G_1$ and the amount $N_{sm2}$ of charge accumulated in the time window defined by the control pulse $G_2$ is reflected in the distance information. When this ratio is calculated, the charge amount $N_B$ caused by noise such as background light is excluded. Further, when the arrival timing of the incident pulsed light $L_R$ is the timing $TI_2$, the distance calculation is performed by selectively using the distance calculation reference signal $R_1$ or the distance calculation reference signal $R_2$, such that a ratio between the amount of charge accumulated in the time window defined by the control pulse $G_2$ and the amount of charge accumulated in the time window defined by the control pulse $G_3$ is reflected in the distance information. Similarly, when the arrival timing of the incident pulsed light $L_R$ is the timing $TI_3$, the distance calculation is performed by selectively using the distance calculation reference signal $R_2$ or the distance calculation reference signal $R_3$, such that a ratio between the amount of charge accumulated in the time window defined by the control pulse $G_3$ and the amount of charge accumulated in the time window defined by the control pulse $G_4$ is reflected in the distance information. Further, when the arrival timing of the incident pulsed light $L_R$ is the timing $TI_4$, the distance calculation is performed by using the distance calculation reference signal $R_3$, such that a ratio between the amount N of charge accumulated in the time window defined by the control pulse $G_4$ and the amount of charge accumulated in the time window defined by the control pulse $G_1$ is reflected in the distance information. That is, the distance information is calculated by selectively using the distance calculation reference signals $R_1$, $R_2$, and $R_3$ having a linear relationship with the delay time $T_D$ in correspondence to the arrival timing of the incident pulsed light $L_R$, as illustrated in FIG. 16.

Hereinafter, a measurement result of the distance calculation of the 4-tap 4-zone scheme according to the embodiment will be described.

Figure 17:
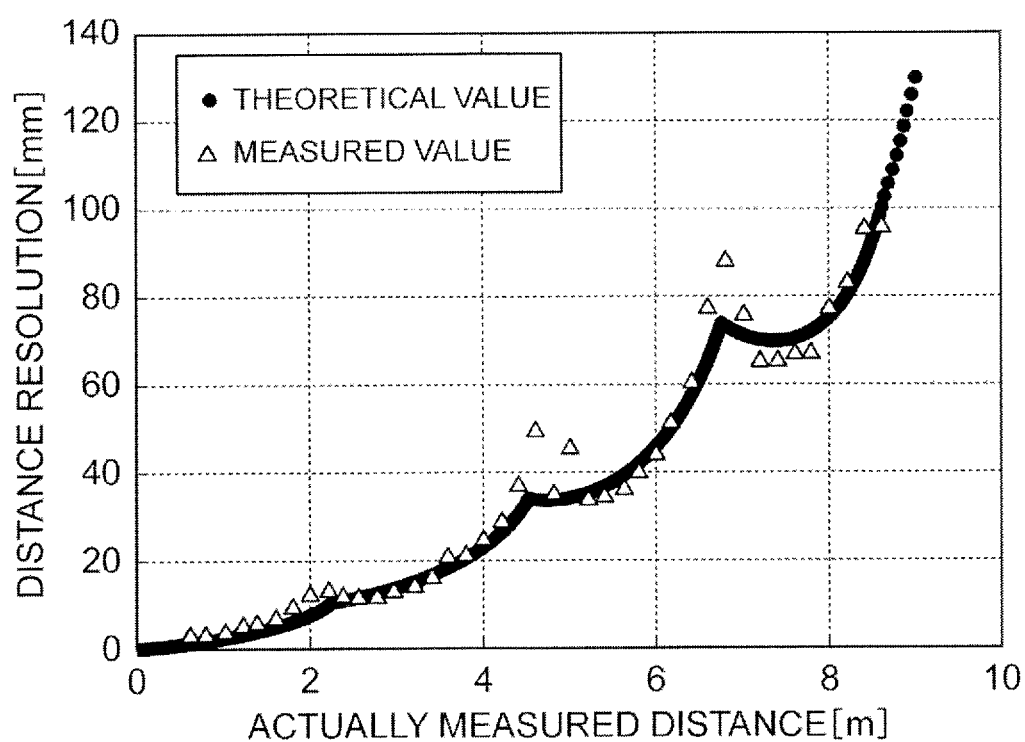
FIG. 17 illustrates a graph showing a distance resolution of distance information calculated by the distance image sensor 10A in FIG. 10 through comparison with a theoretical value.

FIG. 17 illustrates a graph showing the distance resolution of the distance information calculated by the distance image sensor 10A when the actually measured distance to the target S is variously changed, through comparison with a theoretical value. From this result, it can be seen that the distance resolution is well matched with a theoretical value, and the distance resolution of about 1/100 of the actually measured distance is obtained when the actually measured distance is in a range of 0 to 8 m.

Figure 18:
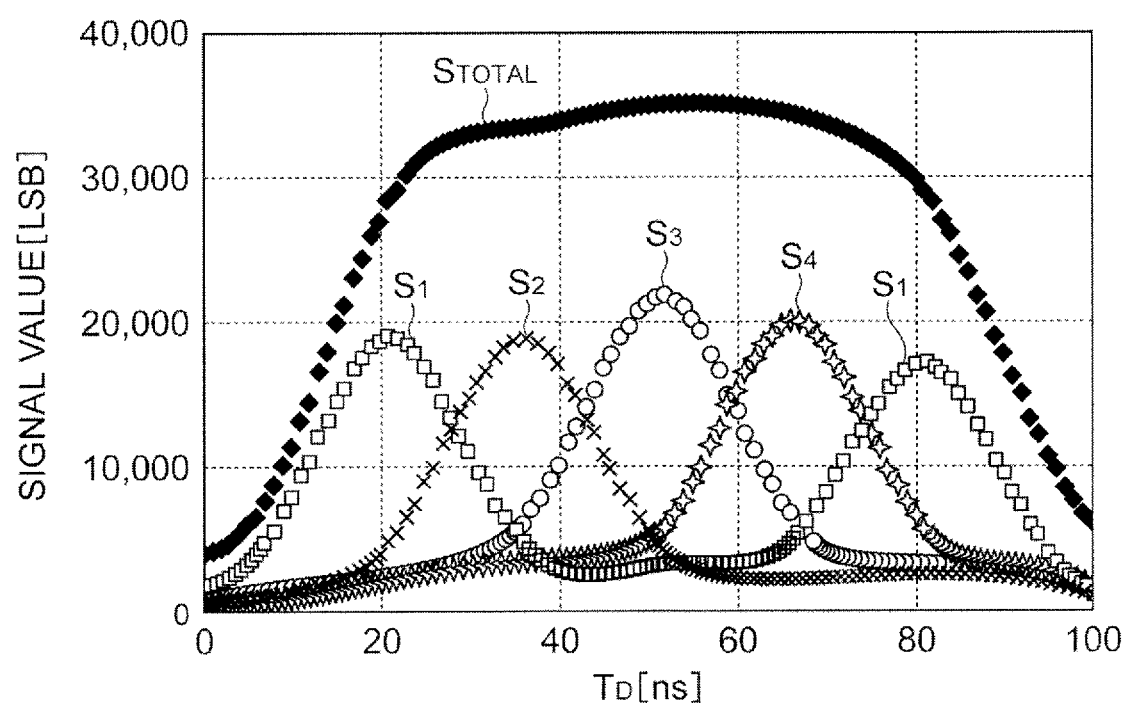
FIG. 18 illustrates first to fourth detection signals $S_1$ to $S_4$ detected in correspondence to a delay time $T_D$ of incident pulsed light $L_R$ by the distance image sensor 10A in FIG. 10, and an intensity of a sum value $S_{TOTAL}$ of these signals.

FIG. 18 illustrates the first to fourth detection signals $S_1$ to $S_4$ detected in correspondence to the delay time $T_D$ of the incident pulsed light $L_R$ by the distance image sensor 10A, and an intensity of a sum value $S_{TOTAL}$ of the signals. Here, the duration $T_0$ of the pulsed light $L_P$ and the duration $T_1$ of the control pulses $G_1$ to $G_4$ are both set to 15 [ns]. It can be seen from the measurement results that peaks of the detection signals $S_1$ to $S_4$ appear at different delay times $T_D$, and the detection signals $S_1$ to $S_4$ are generated with the charge amount distributed according to the delay times $T_D$ being reflected.

Figure 19:
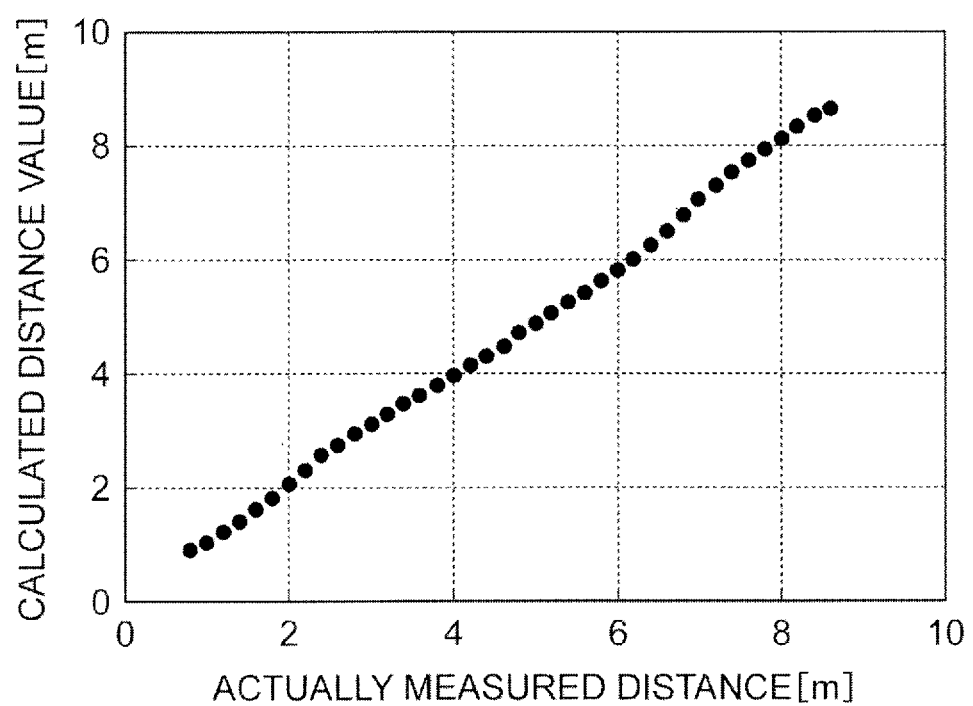
FIG. 19 is a graph showing a distance measured for each actually measured distance to the target S by the distance image sensor 10A in FIG. 10.

Further, FIG. 19 illustrates a graph showing the distance measured by the distance image sensor 10A for each actually measured distance to the target S. Here, distance images were generated at an interval of 15.7 fps, and distance measurement result was averaged over 30 distance images. It was seen from this measurement result that the measured distance value was well matched with the actually measured distance in a range of 1 in to 8 m.

Figure 20:
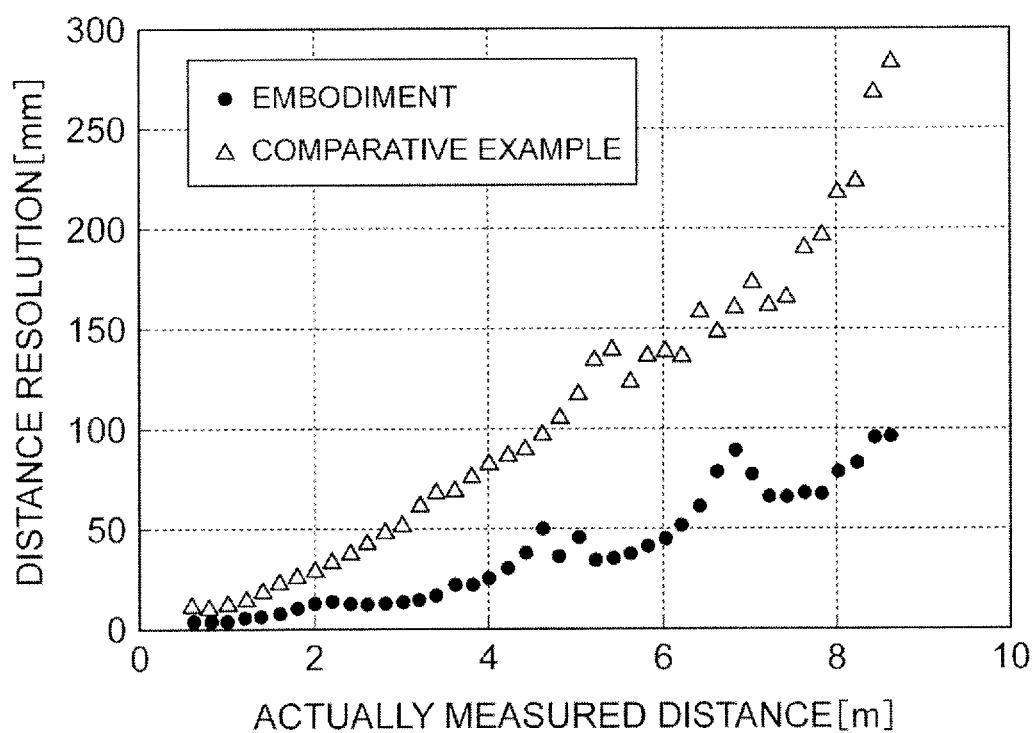
FIG. 20 is a graph showing a resolution of a distance measured by the distance image sensor 10A in FIG. 10.

FIG. 20 is a graph showing a resolution of the distance measured by the distance image sensor 10A for each actually measured distance to the target S through comparison with a comparative example. In the comparative example, a pixel circuit including two charge readout regions and two control electrodes corresponding thereto was used, and the distance was measured using a detection signal read out from the charge readout regions. From a result thereof, a value of a resolution in the distance calculation according to the embodiment is equal to or less than ½ of the comparative example, and the distance resolution is sufficiently improved.

Here, it is preferable for the threshold values used in the first and second embodiments described above to be set as follows.

That is, a first threshold value $Th_1$ is a threshold value set for the distance data validity determination signal $S_A$. The distance data validity determination signal $S_A$ is calculated through linear computation for the detection signals $S_1$ to $S_M$ (M is an integer equal to or greater than 3) and is set as a denominator of a calculation equation for calculating the distance calculation reference signals $X_R$, $Y_R$, and $R_1$ to $R_3$. The first threshold value $Th_1$ is a threshold value intended to determine a range in which the distance data validity determination signal $S_A$ serving as a denominator has a finite value other than "0" and the calculation of the distance calculation reference signals $X_R$, $Y_R$, and $R_1$ to $R_3$ is valid. Therefore, since the distance data validity determination signal $S_A$ is calculated through the linear computation for the detection signals $S_1$ to $S_M$, it is preferable for the first threshold value $Th_1$ to be determined to exceed an RMS value of a noise voltage when there are no detection signals $S_1$ to $S_M$.

On the other hand, the threshold values $Th_2$, $Th_3$, $Th_5$, and $Th_6$ are set for the distance calculation reference signals $X_R$, $Y_R$, and $R_1$ to $R_3$. Threshold values other than the last threshold values for determining the measurement possibility range ($Th_2$ in FIGS. 3 and 4, $Th_3$ in FIG. 12, and $Th_6$ in FIG. 13) are set to approximately a value of the distance calculation reference signal corresponding to the vicinity of the switching of the time window. Accordingly, it is preferable for the last threshold value for determining the measurement possibility range to be determined to be a value obtained by subtracting a value determined to exceed the RMS value of the noise voltage when there are no detection signals $S_1$ to $S_M$, which corresponds to a value of the first threshold value $Th_1$, from a value of a distance time reference signal corresponding to an end of a last time window (for example, "4" that is maximum value of $R_3$ in FIG. 13), which causes a maximum value of a last distance calculation reference signal.

The present invention is not limited to an aspect of the above-described embodiment.

Although three or four charge readout regions are provided in the pixel circuit in the above-described embodiment, five or more charge readout regions may be provided. In this case, the control electrodes and the charge detection means are provided in correspondence to the number of charge readout regions, and the computing circuit 12 calculates distance information on the basis of detection signals read from the respective charge readout regions.

Further, although the calculation of the distance for each pixel circuit 13 is repeatedly executed at each light emission timing of the pulsed light $L_P$ in the above-described embodiment, the calculation may be repeatedly executed at every plurality of light emission timings of the pulsed light $L_P$.

Figure 21:
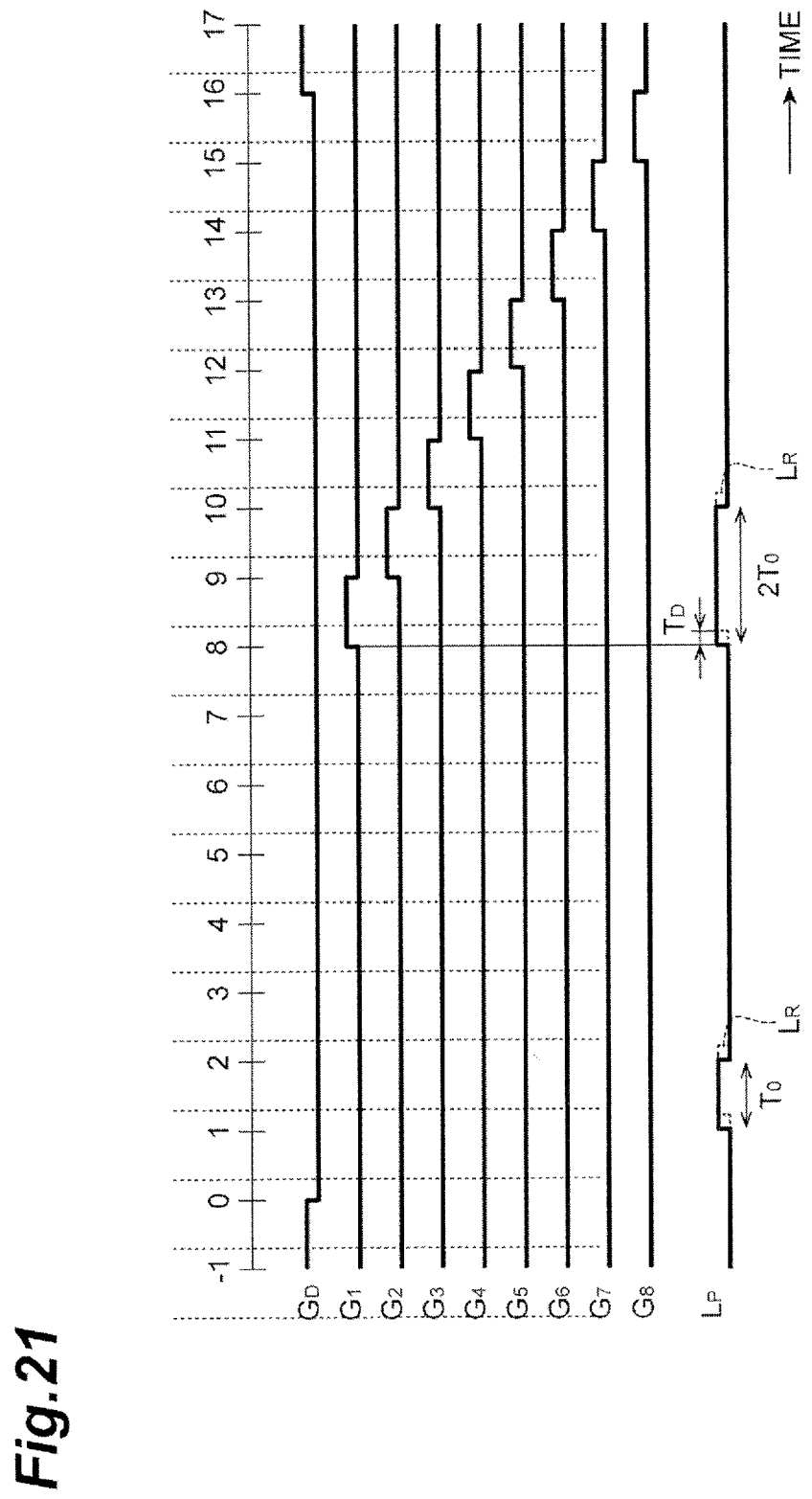
FIG. 21 is a timing chart of various signals that are handled in a distance calculation procedure according to a modification example of the present invention.
Figure 22:
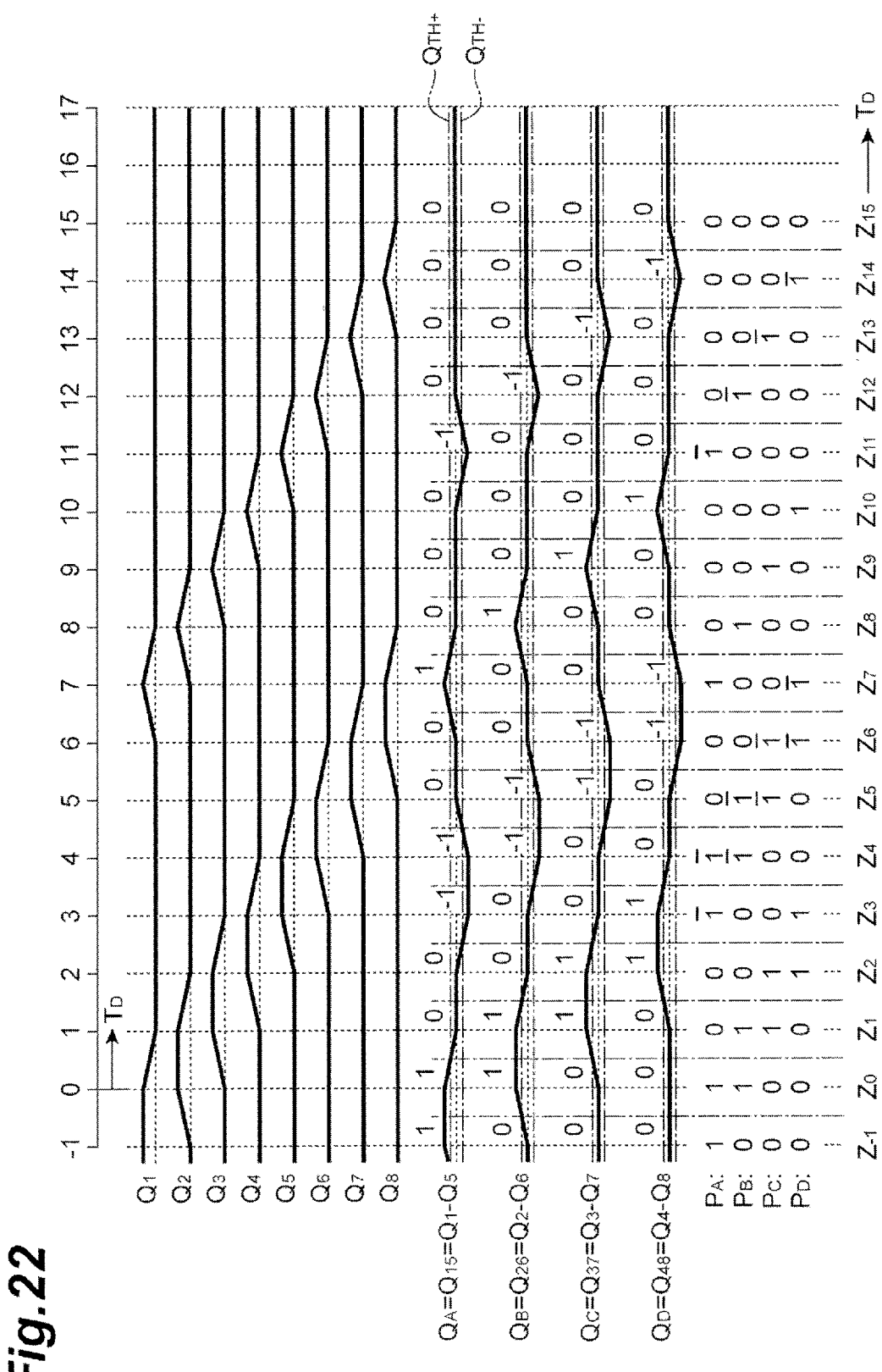
FIG. 22 is a graph showing changes in various values calculated in a distance calculation procedure according to the modification example of the present invention with respect to a delay time $T_D$.
Figure 23:
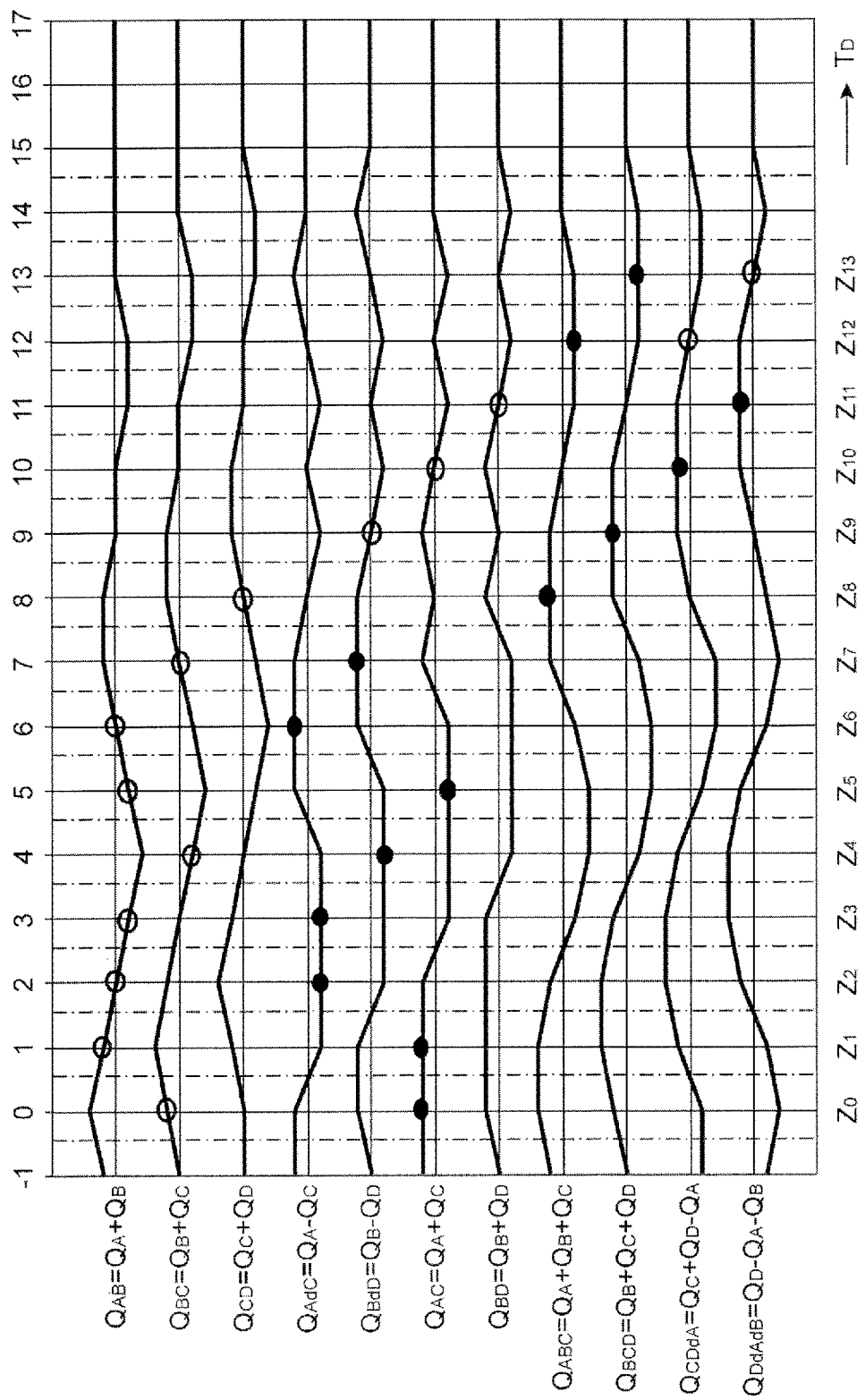
FIG. 23 is a graph showing changes in various values calculated in a distance calculation procedure according to the modification example of the present invention with respect to a delay time $T_D$.

A modification example of the present invention in a case in which each pixel circuit 13 includes eight charge readout regions and the computing circuit 12 executes the distance calculation at every two light emission timings of the pulsed light $L_P$ will be described herein. FIG. 21 is a timing chart of various signals that are handled in the distance calculation procedure of the modification example, and FIGS. 22 and 23 illustrate graphs showing changes in various values calculated in the distance calculation procedure of the modification example with respect to the delay time $T_D$. FIG. 21 illustrates timings of control pulses $G_1$ to $G_8$ that are applied to eight control electrodes, a control pulse $G_D$, and two pulsed light beams $L_P$. FIG. 22 illustrates values of first to eighth detection signals $Q_1$ to $Q_8$, which are read out from eight charge readout regions, values of zone determination signals $Q_A$ to $Q_D$, and values of comparison signals $P_A$ to $P_D$, in correspondence to the delay time $T_D$. FIG. 23 illustrates a value of a distance calculation reference signal, which is a basis of distance calculation, in correspondence to the delay time $T_D$.

In this modification example, the light source control means 31 of the computing circuit 12 is controlled such that two pulsed light beams $L_P$ of first pulsed light with a duration $T_0$ and second pulsed light with a duration $2 T_0$ are generated with a time difference $7 T_0$, as illustrated in FIG. 21. At the same time, the charge transfer control means 32 of the computing circuit 12 turns OFF a control pulse $G_D$ for charge discharge the duration $T_0$ prior to the first pulsed light with the duration $T_0$, and sequentially applies the control pulses $G_1$ to $G_8$ with the duration $T_0$ not to overlap each other in synchronization with the generation of the second pulsed light with the duration $2 T_0$.

Under such timing control of the pulsed light and the control pulse, the first to eighth detection signals $Q_1$ to $Q_8$ read from the eight charge readout regions fluctuate according to the delay time $T_D$ (FIG. 22). The computing circuit 12 of the modification example calculates the zone determination signal for determining a zone of the distance to the target S on the basis of the first to eighth detection signals $Q_1$ to $Q_8$ using the following equations:

$$Q_A = Q_1 - Q_5$$

$$Q_B = Q_2 - Q_6$$

$$Q_C = Q_3 - Q_7$$

$$Q_D = Q_4 - Q_8$$

A combination of magnitude relationships of values of these zone signals is determined for each delay time $T_D$, and the zone of the distance to the target S can be determined by using such a property.

In addition, the computing circuit 12 calculates the following values as values to be referred to for calculation of the distance in respective zones.

$$Q_{AB} = Q_A + Q_B,$$

$$Q_{BC} = Q_B + Q_C,$$

$$Q_{CD} = Q_C + Q_D,$$

$$Q_{AdC} = Q_A - Q_C,$$

$$Q_{BdD} Q_B - Q_D,$$

$$Q_{AC} = Q_A + Q_C,$$

$$Q_{BD} = Q_B + Q_D,$$

$$Q_{ABC} = Q_A + Q_B + Q_C,$$

$$Q_{BCD} = Q_B + Q_C + Q_D,$$

$$Q_{CDdA} = Q_C + Q_D - Q_A,$$

$$Q_{DdAdB} = Q_D - Q_A - Q_B$$

Further, the computing circuit 12 compares each of the zone determination signals $Q_A$ to $Q_D$ with two threshold values $Q_{TH+}$ and $Q_{TH-}$, thereby generating comparison signals $P_A$ to $P_D$ with three values ($-1$, 0, 1). That is, each of the comparison signals $P_A$ to $P_D$ is set to a value "$-1$" when the zone determination signals $Q_A$ to $Q_D$ are smaller than the threshold value $Q_{TH-}$, to a value "0" when the zone determination signals $Q_A$ to $Q_D$ are equal to or greater than the threshold value $Q_{TH-}$ and equal to or smaller than the threshold value $Q_{TH+}$, and to a value "1" when the zone determination signals $Q_A$ to $Q_D$ exceed the threshold value $Q_{TH+}$. The distance calculation reference signal selection means 37 of the computing circuit 12 determines the zone of the distance to the target S on the basis of a combination of the values of the comparison signals $P_A$ to $P_D$. For example, the zone is determined to be a zone $Z_{-1}$ outside the measurement possibility range when $(P_A, P_B, P_C, P_D) = (1, 0, 0, 0)$, a zone $Z_0$ when $(P_A, P_B, P_C, P_D) = (1, 1, 0, 0)$, a zone $Z_1$ when $(P_A, P_B, P_C, P_D) = (0, 1, 1, 0)$, and a zone $Z_2$ when $(P_A, P_B, P_C, P_D) = (0, 0, 1, 1)$. Further, the zone is determined to be a zone $Z_{13}$ when $(P_A, P_B, P_C, P_D) = (0, 0, -1, 0)$, and a zone $Z_{14}$ outside the measurement possibility range when $(P_A, P_B, P_C, P_D) = (0, 0, 0, -1)$ (FIG. 22). After the zone determination, the distance calculation reference signal selection means 37 selects two values corresponding to the zone of the distance from among values calculated in advance, as the distance calculation reference signals to be used for the distance calculation. In this case, the distance calculation reference signal to be selected may be calculated in advance, or may be calculated again after the zone determination. In FIG. 23, a value indicated by a black circle indicates a value to be used as the denominator in a process of the distance calculation among values selected in correspondence to each zone, and a value indicated by a white circle indicates a value to be used as the numerator in a process of the distance calculation among values selected in correspondence to each zone. For example, when the zone is determined to be the zone $Z_0$, the distance calculation reference signal $Q_{AC}$ is selected as the value to be used as the denominator, and the distance calculation reference signal $Q_{BC}$ is selected as the value to be used as the numerator. When the zone is determined to be the zone $Z_{13}$, the distance calculation reference signal $Q_{BCD}$ is selected as a value to be used as the denominator, and the distance calculation reference signal $Q_{DdAdB}$ is selected as a value to be used as the numerator. A method of selecting the distance calculation reference signal illustrated in FIG. 23 is an example, and a distance calculation reference signal that changes linearly with respect to the delay time $T_D$ from the short distance side to the long distance side of each zone and does not cause a change point (an inflection point) of a change rate in an inside of the zone or a boundary between the zones may be selected as a value of a numerator. The distance calculation reference signal that does not cause the change point (the inflection point) of the change rate at the boundary between the zones is used to prevent a calculated value from being discontinuous at a boundary portion between the two zones. Further, the distance calculation reference signal that has a constant value from the short distance side to the long distance side of each zone may be selected as a value of a denominator.

Using the distance calculation reference signal selected by the distance calculation reference signal selection means 37, the distance image generation means 38 of the computing circuit 12 of the modification example calculates a distance L of the target S in correspondence to the respective determined zones $Z_0$ to $Z_{13}$ using the following equations. In the following equations, c indicates a speed of light.

Zone $Z_0$: $L=(\frac{1}{2})cT_0\{(Q_{BC}/Q_{AC})-1\}$,

Zone $Z_1$: $L=(\frac{1}{2})cT_0\{(-Q_{AB}/Q_{AC})+2\}$,

Zone $Z_2$, Zone $Z_3$: $L=(\frac{1}{2})cT_0\{(Q_{AB}/Q_{AdC})+2\}$,

Zone $Z_4$: $L=(\frac{1}{2})cT_0\{(Q_{BC}/Q_{BdD})+3\}$,

Zone $Z_5$: $L=(\frac{1}{2})cT_0\{(Q_{AB}/Q_{AC})+6\}$,

Zone $Z_6$: $L=(\frac{1}{2})cT_0\{(Q_{AB}/Q_{AdC})+6\}$,

Zone $Z_7$: $L=(\frac{1}{2})cT_0\{(Q_{BC}/Q_{BdD})+7\}$,

Zone $Z_8$: $L=(\frac{1}{2})cT_0\{(Q_{CD}/Q_{ABC})+8\}$,

Zone $Z_9$: $L=(\frac{1}{2})cT_0\{(-Q_{BdD}/Q_{BCD})+9\}$,

Zone $Z_{10}$: $L=(\frac{1}{2})cT_0\{(-Q_{AC}/Q_{CdA})+10\}$,

Zone $Z_{11}$: $L=(\frac{1}{2})cT_0\{(-Q_{BD}/Q_{DdAdB})+1\}$,

Zone $Z_{12}$: $L=(\frac{1}{2})cT_0\{(Q_{CdA}/Q_{ABC})\pm 12\}$,

Zone $Z_{13}$: $L=(\frac{1}{2})cT_0\{(Q_{DdAdB}/Q_{BCD})+13\}$

Although amplitudes (light intensities) of the pulses of the two pulsed light beams are set to be the same in the modification example, the amplitudes of the two pulsed light beams may be changed. For example, the amplitude of the first pulsed light may be set to be smaller than the amplitude of the second pulsed light.

Figure 24:
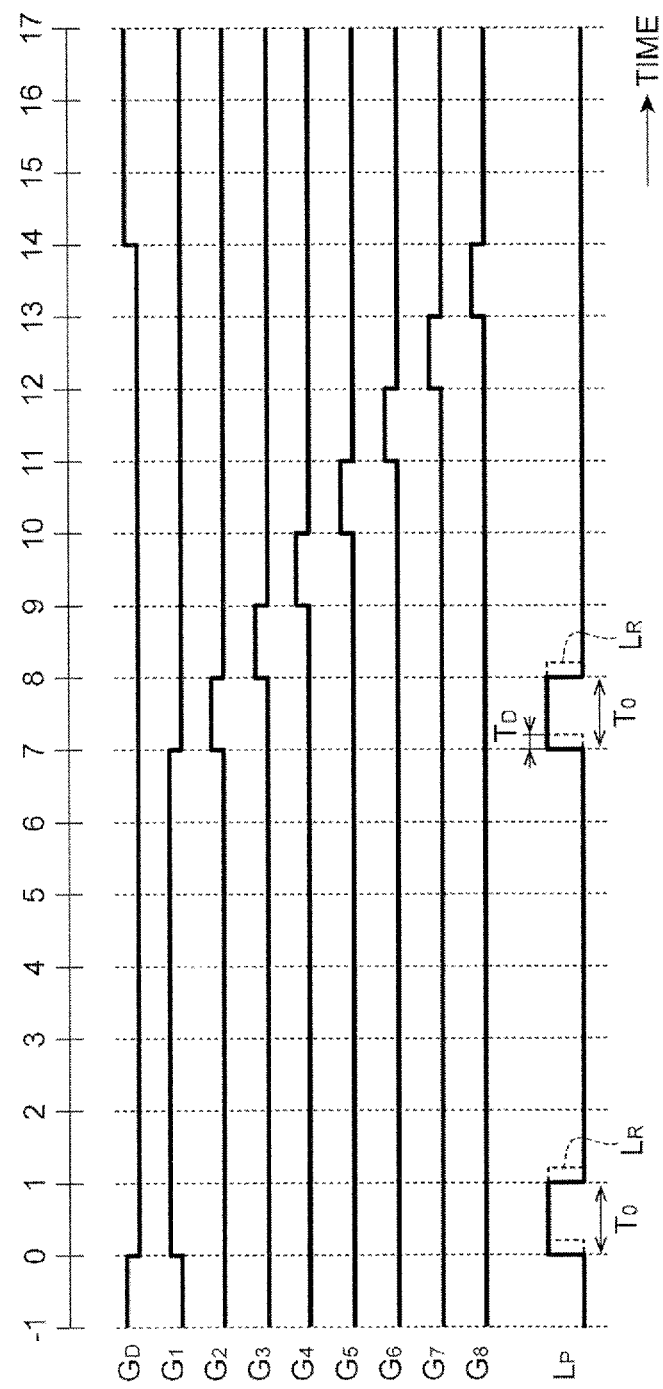
FIG. 24 is a timing chart of various signals that are handled in a distance calculation procedure according to the modification example of the present invention.
Figure 25:
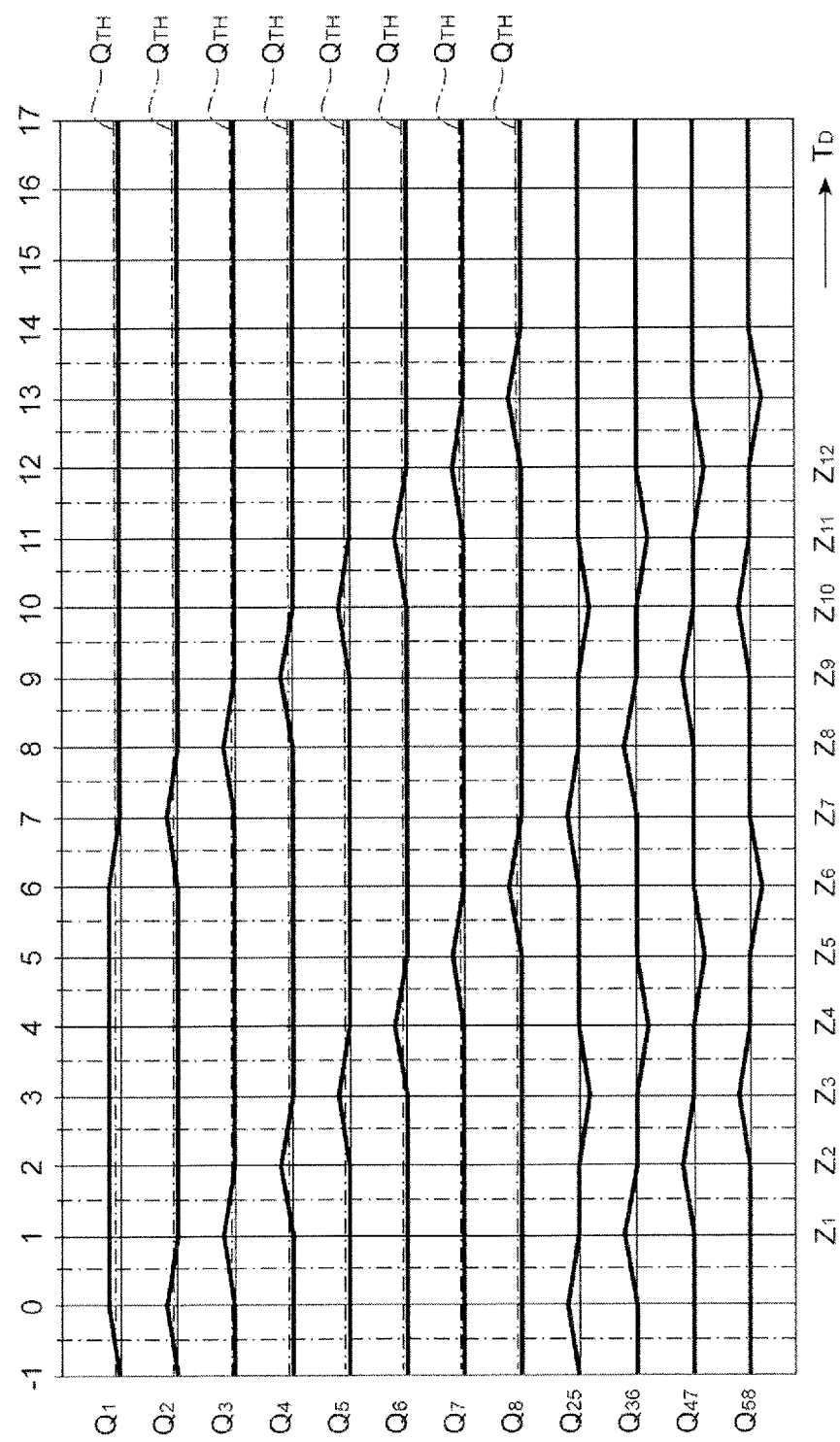
FIG. 25 is a graph showing changes in various values calculated in a distance calculation procedure according to the modification example of the present invention with respect to a delay time $T_D$.

Further, the distance calculation may be executed at every two light emission timings of the pulsed light $L_P$, which is emitted in the same cycle. FIG. 24 is a timing chart of various signals that are handled in the distance calculation procedure of the modification example in such a case, and FIGS. 25 and 26 illustrate graphs showing changes in various values calculated in the distance calculation procedure of the modification example with respect to the delay time $T_D$. FIG. 24 illustrates timings of control pulses $G_1$ to $G_8$ that are applied to eight control electrodes, a control pulse $G_D$, and two pulsed light beams $L_P$. FIG. 25 illustrates values of first to eighth detection signals $Q_1$ to $Q_8$ read out from eight charge readout regions, and a value of an intermediate computation signal calculated on the basis of these in correspondence to the delay time $T_D$. FIG. 26 illustrates a value of a distance calculation reference signal, which is a basis of distance calculation, in correspondence to the delay time $T_D$.

In this modification example, the light source control means 31 of the computing circuit 12 is controlled to generate two pulsed light beams $L_P$ of first pulsed light with a duration $T_0$ and second pulsed light with a duration $T_0$ with a time difference $7 T_0$, as illustrated in FIG. 24. At the same time, the charge transfer control means 32 of the computing circuit 12 turns OFF the control pulse $G_D$ for charge discharge immediately before the generation of the first pulsed light with the duration $T_0$, and sequentially applies the control pulses $G_2$ to $G_8$ with the duration $T_0$ not to overlap each other in synchronization with the generation of the second pulsed light after the control pulse $G_1$ with a duration $7 T_0$ is applied between a generation start timing of the first pulsed light and a generation start timing of the second pulsed light.

Under such timing control of the pulsed light and the control pulse, the first to eighth detection signals $Q_1$ to $Q_8$ read out from the eight charge readout regions fluctuate according to the delay time $T_D$ (FIG. 25). In the computing circuit 12 of the modification example, the first to eighth detection signals $Q_1$ to $Q_8$ are referred to as zone determination signals for determining the zone of the distance to the target S. A combination of magnitude relationship between a value of the first detection signal $Q_1$ and a value of any one of the other signals $Q_2$ to $Q_8$ among these zone determination signals is determined for each delay time $T_D$, and the zone of the distance to the target S can be determined by using such a property.

Specifically, the distance calculation reference signal selection means 37 of the computing circuit 12 compares each of the signals $Q_1$ to $Q_8$ with a predetermined threshold value $Q_{TH}$, and determines which of the following combinations a comparison result regarding the signal $Q_1$ and a comparison result regarding the other signals $Q_2$ to $Q_8$ correspond to, thereby determining the zone of the distance to the target S from among the zones $Z_1$ to $Z_{12}$ (FIG. 25).

Zone $Z_1$: $Q_1 \geq Q_{TH}$, and $Q_3 \geq Q_{TH}$,

Zone $Z_2$: $Q_1 \geq Q_{TH}$ and $Q_4 \geq Q_{TH}$,

Zone $Z_3$: $Q_1 \geq Q_{TH}$ and $Q_5 \geq Q_{TH}$,

Zone $Z_4$: $Q_1 \geq Q_{TH}$ and $Q_6 \geq Q_{TH}$,

Zone $Z_5$: $Q_1 \geq Q_{TH}$ and $Q_7 \geq Q_{TH}$,

Zone $Z_6$: $Q_1 \geq Q_{TH}$ and $Q_8 \geq Q_{TH}$,

Zone $Z_7$: $Q_1 < Q_{TH}$, and $Q_2 \geq Q_{TH}$,

Zone $Z_8$: $Q_1 < Q_{TH}$, and $Q_3 \geq Q_{TH}$,

Zone $Z_9$: $Q_1 < Q_{TH}$, and $Q_4 \geq Q_{TH}$,

Zone $Z_{10}$: $Q_1 < Q_{TH}$, and $Q_5 \geq Q_{TH}$,

Zone $Z_{11}$: $Q_1 < Q_{TH}$, and $Q_6 \geq Q_{TH}$,

Zone $Z_{12}$: $Q_1 < Q_{TH}$ and $Q_7 \geq Q_{TH}$

In addition, the computing circuit 12 calculates intermediate computation signals $Q_{25}$, $Q_{36}$, $Q_{47}$, and $Q_{58}$ (FIG. 25) for distance calculation on the basis of the signals $Q_1$ to $Q_8$ using the following equations, and calculates distance calculation reference signals $Q_A$ to $Q_L$ (FIG. 26) to be referred to for distance calculation for each zone on the basis of these intermediate computation signals using the following equations.

$Q_{25}=Q_2-Q_5$ $Q_{36}=Q_3-Q_6$ $Q_{47}=Q_4-Q_7$, $Q_{58}=Q_5-Q_8$, $Q_A=Q_{25}+Q_{36}$, $Q_B=Q_{36}+Q_{47}$, $Q_C = Q_{47} + Q_{58}$, $Q_D = Q_{25} - Q_{47}$, $Q_E = Q_{36} - Q_{58}$, $Q_F = Q_{25} + Q_{47}$, $Q_G = Q_{36} + Q_{58}$, $Q_H = Q_{25} + Q_{36} + Q_{47}$, $Q_I = Q_{36} + Q_{47} + Q_{58}$, $Q_J = Q_{47} - Q_{25} - Q_{36}$, $Q_K = Q_{47} + Q_{58} - Q_{25}$, $Q_L = Q_{58} - Q_{25} - Q_{36}$

After the zone determination, the distance calculation reference signal selection means 37 selects two values corresponding to the zone of the distance from among the distance calculation reference signals $Q_A$ to $Q_L$ calculated in advance, as the distance calculation reference signals to be used for the distance calculation. In this case, the distance calculation reference signal to be selected may be calculated in advance, or may be calculated again after the zone determination. In FIG. 26, a value indicated by a black circle indicates a value to be used as the denominator in a process of the distance calculation among values selected in correspondence to each zone, and a value indicated by a white circle indicates a value to be used as the numerator in a process of the distance calculation among values selected in correspondence to each zone. For example, when the zone is determined to be the zone $Z_1$, the distance calculation reference signal $Q_H$ is selected as the value to be used as the denominator, and the distance calculation reference signal $Q_D$ is selected as the value to be used as the numerator. When the zone is determined to be the zone $Z_{12}$, the distance calculation reference signal Q is selected as a value to be used as the denominator, and the distance calculation reference signal $Q_E$ is selected as a value to be used as the numerator. A method of selecting the distance calculation reference signal illustrated in FIG. 26 is an example, and a distance calculation reference signal that changes linearly with respect to the delay time $T_D$ from the short distance side to the long distance side of each zone and does not cause a change point (an inflection point) of a change rate in an inside of the zone or a boundary between the zones may be selected as a value of a numerator. The distance calculation reference signal that does not cause the change point (the inflection point) of the change rate at the boundary between the zones is used to prevent a calculated value from being discontinuous at a boundary portion between the two zones. Further, the distance calculation reference signal that has a constant value from the short distance side to the long distance side of each zone may be selected as a value of a denominator.

Using the distance calculation reference signal selected by the distance calculation reference signal selection means 37, the distance image generation means 38 of the computing circuit 12 of the modification example calculates the distance L of the target S in correspondence to the respective determined zones $Z_1$ to $Z_{12}$ using the following equations. In the following equations, c indicates a speed of light.

Zone $Z_1$: $L = (½)cT_0\{(-Q_D/Q_H)+1\}$,

Zone $Z_2$: $L = (½)cT_0\{(-Q_A/Q_I)+2\}$,

Zone $Z_3$: $L = (½)cT_0\{(-Q_B/Q_J)+3\}$,

Zone $Z_4$: $L = (½)cT_0\{(-Q_C/-Q_H)+4\}$,

Zone $Z_5$: $L = (½)cT_0\{(Q_E/-Q_I)+5\}$,

Zone $Z_6$: $L = (½)cT_0\{(Q_F/-Q_K)+6\}$,

Zone $Z_7$: $L = (½)cT_0\{(Q_G/-Q_L)+7\}$,

Zone $Z_8$: $L = (½)cT_0\{(-Q_D/Q_H)+8\}$,

Zone $Z_9$: $L = (½)cT_0\{(-Q_A/Q_I)+9\}$,

Zone $Z_{10}$: $L = (½)cT_0\{(-Q_B/Q_J)+10\}$,

Zone $Z_{11}$: $L = (½)cT_0\{(-Q_C/-Q_H)+11\}$,

Zone $Z_{12}$: $L = (½)cT_0\{(Q_E/-Q_I)+12\}$

Although amplitudes (light intensities) of pulses of the two pulsed light beams are set to be the same in the modification example, the amplitudes of the two pulsed light beams may be changed. For example, the amplitude of the first pulsed light may be set to be smaller than the amplitude of the second pulsed light.

Here, in the above embodiment, the distance calculation means may obtain a distance calculation reference value by calculating a ratio between a difference between two detection signals among the first to M-th detection signals and a sum value of the signal components, determine whether or not the distance calculation reference value is valid according to a result of comparison between the distance calculation reference value and a predetermined second threshold value, and calculate the distance on the basis of the distance calculation reference value when the distance calculation reference value is valid. In this case, it is possible to appropriately determine whether or not the target is located outside the measurement possibility range, and to calculate the distance with high accuracy on the basis of a result of the determination.

Further, the distance calculation means may calculate a ratio between a difference between one set of detection signals among the first to M-th detection signals and a sum value of the signal components to obtain a first distance calculation reference value, calculate a ratio between a difference between the other sets of detection signals among the first to M-th detection signals and the sum value of the signal components to obtain a second distance calculation reference value, and select any one of the first distance calculation reference value and the second distance calculation reference value according to a result of comparison between the first distance calculation reference value and a third predetermined threshold value to calculate the distance. In this case, it is possible to calculate the distance using an appropriate reference value in correspondence to a range in which the target is located, and, as a result, to generate a highly accurate image signal regardless of the position of the target.

Further, the pixel circuit part may further include a charge discharge region for discharging charge accumulated in the photoelectric conversion region, and a control electrode for applying a control pulse for charge transfer between the photoelectric conversion region and the charge discharge region. Thereby, it is possible to prevent the charge generated in the photoelectric conversion region during a period in which the first to M-th control pulses are not applied from being transferred to the first to M-th charge readout regions.

Further, the distance calculation means may generate an identification value indicating whether the calculation of the distance is invalid. In this case, it is possible to easily determine whether or not the distance calculation is valid.

Further, the charge transfer control means, a circuit between the charge transfer control means and the first to M-th control electrodes, and a part of a circuit between the charge transfer control means and the light source control means may be formed on the same semiconductor layer as the pixel circuit part or on a semiconductor layer stacked with respect to the pixel circuit part. In this case, it is possible to easily improve the resolution of the distance calculation.

Further, the pixel circuit part may include image sensors arranged in a two-dimensional array. According to such a configuration, it is possible to generate a distance image including highly accurate two-dimensional distance information regardless of the position of the target.

INDUSTRIAL APPLICABILITY

According to an aspect of the present invention, the distance image measuring apparatus and the distance image measuring method for generating the distance image including the distance information for each pixel are adopted as a use purpose, thereby generating a highly accurate image signal regardless of the position of the target.

REFERENCE SIGNS LIST 10, 10A: Distance image sensor (distance image measuring apparatus)
11: Light source
12: Computing circuit
13: Pixel circuit (pixel circuit part)
21: Photoelectric conversion region
$22_1$ to $22_4$: Charge readout region
$24_1$ to $24_4$: Control electrode
$26_1$ to $26_4$: Voltage detection means
31: Light source control means
32, 32A: Charge transfer control means
33, 33A: Distance data validity determination signal generation means
34, 34A: Distance data validity determination means
35: Invalid pixel identification value generation means
36, 36A: Distance calculation reference signal generation means
37, 37A: Distance calculation reference signal selection means
38: Distance image generation means

The invention claimed is:

1. A distance image measuring apparatus comprising:
a light source configured to generate pulsed light;
a light source controller configured to control the light source so that the light source repeatedly generates the pulsed light with a first duration within a period of one frame;
a pixel circuit part including a photoelectric conversion region configured to convert light into charge, first to M-th (M is an integer equal to or greater than 3) charge readout regions provided in proximity to the photoelectric conversion region and apart from each other, and first to M-th control electrodes provided in correspondence to the photoelectric conversion region and the first to M-th charge readout regions, for applying first to M-th control pulses for charge transfer between the photoelectric conversion region and the first to M-th charge readout regions;
a charge transfer controller configured to apply the first control pulse to the first control electrode during a second duration, the second duration being equal to or longer than the first duration in correspondence to the generation of the pulsed light by the light source controller, and then, sequentially apply the second to M-th control pulses to the second to M-th control electrodes during the second duration;
a circuitry configured to read out voltages of the first to M-th charge readout regions of the pixel circuit part as first to M-th detection signals after the application of the first to M-th control pulses by the charge transfer controller and
configured to repeatedly calculate a distance on the basis of the first to M-th detection signals,
wherein the circuitry calculates a sum value of signal components of charge generated from the pulsed light other than background light in the first to M-th detection signals on the basis of the first to M-th detection signals, calculates the distance from the first to M-th detection signals using a predetermined calculation equation when the sum value of the signal components exceeds a first predetermined threshold value, and invalidates the calculation of the distance when the sum value of the signal components does not exceed the first threshold value, and
the circuitry adds an absolute value of a difference between the two detection signals among the first to M-th detection signals to calculate the sum value.

2. The distance image measuring apparatus according to claim 1, wherein the circuitry calculates a ratio between a difference between two detection signals among the first to M-th detection signals and a sum value of the signal components to obtain a distance calculation reference value, determines whether or not the distance calculation reference value is valid according to a result of comparison between the distance calculation reference value and a predetermined second threshold value, and calculates the distance on the basis of the distance calculation reference value when the distance calculation reference value is valid.

3. The distance image measuring apparatus according to claim 1, wherein the circuitry calculates a ratio between a difference between one set of detection signals among the first to M-th detection signals and a sum value of the signal components to obtain a first distance calculation reference value, calculates a ratio between a difference between the other sets of detection signals among the first to M-th detection signals and the sum value of the signal components to obtain a second distance calculation reference value, and selects any one of the first distance calculation reference value and the second distance calculation reference value according to a result of comparison between the first distance calculation reference value and a third predetermined threshold value to calculate the distance.

4. The distance image measuring apparatus according to claim 1, wherein the pixel circuit part further includes
a charge discharge region for discharging charge accumulated in the photoelectric conversion region, and
a control electrode for applying a control pulse for charge transfer between the photoelectric conversion region and the charge discharge region.

5. The distance image measuring apparatus according to claim 1, wherein the circuitry generates an identification value indicating whether the calculation of the distance is invalid.

6. The distance image measuring apparatus according to claim 1, wherein the charge transfer controller, a circuit between the charge transfer controller and the first to M-th control electrodes, and a part of a circuit between the charge transfer controller and the light source controller are formed on the same semiconductor layer as the pixel circuit part or on a semiconductor layer stacked on the pixel circuit part.

7. The distance image measuring apparatus according to claim 1, wherein the pixel circuit part includes an image sensor arranged in a two-dimensional array.

8. The distance image measuring apparatus according to claim 1, wherein the circuitry calculates differences, as zone detection signals, between each pair of different detection signals selected from the first to M-th detection signals,
   compares each of the zone detection signals with a threshold value to obtain comparison values on an amplitude of the zone detection signals, determines a zone on the basis of combination of the comparison values of the zone detection signals, and
   calculates an predetermined equation corresponding to the determined zone, using any one of zone detection signals, to calculate the distance.

9. A distance image measuring method comprising:
   controlling, by a light source controller, a light source so that the light source repeatedly generates a pulsed light with a first duration within a period of one frame;
   applying, by a charge transfer controller, a first control pulse for controlling transfer of charge to a first control electrode during a second duration, the second duration being equal to or longer than the first duration in correspondence to the generation of the pulsed light by the light source controller, and then, sequentially applying second to M-th control pulses for controlling transfer of charge to second to M-th control electrodes during the second duration, by using a pixel circuit part including a photoelectric conversion region configured to convert light into charge, first to M-th (M is an integer equal to or greater than 3) charge readout regions provided in proximity to the photoelectric conversion region and apart from each other, and the first to M-th control electrodes provided in correspondence to the photoelectric conversion region and the first to M-th charge readout regions;
   reading out, by a circuitry, voltages of the first to M-th charge readout regions of the pixel circuit part as first to M-th detection signals after the application of the first to M-th control pulses by the charge transfer controller; and
   repeatedly calculating, by the circuitry, a distance on the basis of the first to M-th detection signals,
   wherein the calculating of the distance includes calculating a sum value of signal components of charge generated from the pulsed light other than background light in the first to M-th detection signals on the basis of the first to M-th detection signals, calculating the distance from the first to M-th detection signals using a predetermined calculation equation when the sum value of the signal components exceeds a first predetermined threshold value, and invalidating the calculation of the distance when the sum value of the signal components does not exceed the first threshold value, and
   the calculating of the distance includes adding an absolute value of a difference between the two detection signals among the first to M-th detection signals to calculate the sum value.

10. The distance image measuring method according to claim 9, wherein the calculating of the distance includes obtaining a distance calculation reference value by calculating a ratio between a difference between two detection signals among the first to M-th detection signals and a sum value of the signal components, determining whether or not the distance calculation reference value is valid according to a result of comparison between the distance calculation reference value and a predetermined second threshold value, and calculating the distance on the basis of the distance calculation reference value when the distance calculation reference value is valid.

11. The distance image measuring method according to claim 9, wherein the calculating of the distance includes calculating a ratio between a difference between one set of detection signals among the first to M-th detection signals and a sum value of the signal components to obtain a first distance calculation reference value, calculating a ratio between a difference between the other set of detection signals among the first to M-th detection signals and the sum value of the signal components to obtain a second distance calculation reference value, and selecting any one of the first distance calculation reference value and the second distance calculation reference value according to a result of comparison between the first distance calculation reference value and a third predetermined threshold value to calculate the distance.

12. The distance image measuring method according to claim 9, wherein the calculating of the distance includes calculating differences, as zone detection signals, between each pair of different detection signals selected from the first to M-th detection signals,
   comparing each of the zone detection signals with a threshold value to obtain comparison values on an amplitude of the zone detection signals, determining a zone on the basis of combination of the comparison values of the zone detection signals, and
   calculating an predetermined equation corresponding to the determined zone, using any one of zone detection signals, to calculate the distance.

* * * * *